(12) United States Patent
Ogura et al.

(10) Patent No.: US 11,169,308 B2
(45) Date of Patent: *Nov. 9, 2021

(54) COLOR MATERIAL DISPERSION LIQUID FOR COLOR FILTERS, COLOR MATERIAL, COLOR FILTER, LIQUID CRYSTAL DISPLAY DEVICE AND ORGANIC LIGHT-EMITTING DISPLAY DEVICE

(71) Applicant: DAI NIPPON PRINTING CO., LTD., Tokyo-to (JP)

(72) Inventors: Michihiro Ogura, Tokyo-to (JP); Tomoki Murata, Tokyo-to (JP); Fumiyasu Murakami, Tokyo-to (JP); Masato Okada, Tokyo-to (JP); Hiroaki Segawa, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 27 days.

This patent is subject to a terminal disclaimer.

(21) Appl. No.: 16/373,352

(22) Filed: Apr. 2, 2019

(65) Prior Publication Data

US 2019/0227209 A1 Jul. 25, 2019

Related U.S. Application Data

(62) Division of application No. 15/031,647, filed as application No. PCT/JP2014/068953 on Jul. 16, 2014, now Pat. No. 10,317,592.

(30) Foreign Application Priority Data

Oct. 23, 2013 (JP) ................... 2013-220661

(51) Int. Cl.
| | | |
|---|---|---|
| *G02B 5/22* | (2006.01) | |
| *C09B 11/08* | (2006.01) | |
| *C08B 11/12* | (2006.01) | |
| *C09B 11/24* | (2006.01) | |
| *C09B 35/20* | (2006.01) | |
| *C09B 63/00* | (2006.01) | |
| *G02B 1/04* | (2006.01) | |
| *G02F 1/133* | (2006.01) | |
| *H01L 27/32* | (2006.01) | |

(Continued)

(52) U.S. Cl.
CPC .............. *G02B 5/223* (2013.01); *C09B 11/08* (2013.01); *C09B 11/12* (2013.01); *C09B 11/24* (2013.01); *C09B 35/20* (2013.01); *C09B 63/005* (2013.01); *G02B 1/04* (2013.01); *G02F 1/133514* (2013.01); *H01L 27/322* (2013.01); *H01L 51/0052* (2013.01); *H01L 51/0061* (2013.01)

(58) Field of Classification Search
CPC .......... G02B 5/223; G02B 1/04; C09B 11/08; C09B 11/12; C09B 11/24; C09B 35/20; C09B 63/005; G02F 1/133514; H01L 27/322; H01L 51/0052; H01L 51/0061
USPC ......................................................... 252/586
See application file for complete search history.

(56) References Cited

U.S. PATENT DOCUMENTS

| 7,500,743 B2 | 3/2009 | Takashima | |
|---|---|---|---|
| 2002/0058190 A1* | 5/2002 | Ishiyama | ............. G03G 9/0804 |
| | | | 430/108.1 |

(Continued)

FOREIGN PATENT DOCUMENTS

| JP | 2001-081348 | 3/2001 |
|---|---|---|
| JP | 2006-152223 | 6/2006 |

(Continued)

OTHER PUBLICATIONS

Office Action issued in co-pending U.S. Appl. No. 15/031,647, filed Sep. 20, 2017, 6 pages.

(Continued)

*Primary Examiner* — Ling Siu Choi
*Assistant Examiner* — Ronald Grinsted
(74) *Attorney, Agent, or Firm* — Hamre, Schumann, Mueller & Larson, P.C.

(57) ABSTRACT

Disclosed is a color material dispersion liquid for color filter, which has excellent heat resistance and is able to form a high-luminance coating film. The color material dispersion liquid for color filters includes (A) a color material, (B) a dispersant and (C) a solvent. The color material (A) contains (A-1) a color material represented by the following general formula (I) and (A-2) a metal lake color material of a rhodamine-based acid dye:

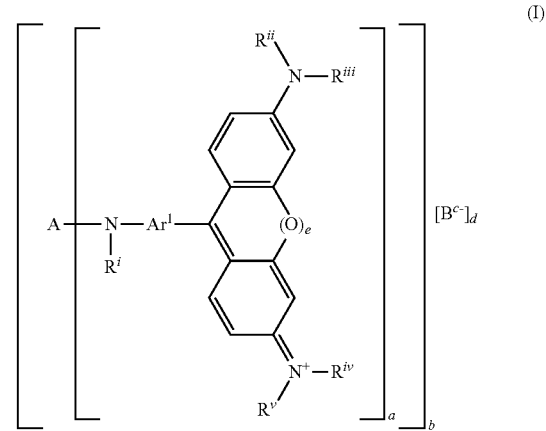

(symbols in the general formula (I) are as described in the Description.).

2 Claims, 1 Drawing Sheet

(51) Int. Cl.
  *H01L 51/00* (2006.01)
  *C09B 11/12* (2006.01)
  *G02F 1/1335* (2006.01)

(56) References Cited

U.S. PATENT DOCUMENTS

| | | |
|---|---|---|
| 2014/0037866 A1 | 2/2014 | Okada |
| 2015/0368473 A1 | 12/2015 | Okada et al. |

FOREIGN PATENT DOCUMENTS

| | | |
|---|---|---|
| JP | 2008-094897 | 4/2008 |
| JP | 2010-026334 | 2/2010 |
| JP | 2010-047539 | 3/2010 |
| JP | 2010-237608 | 10/2010 |
| JP | 2011-075661 | 4/2011 |
| JP | 2012-194523 | 10/2012 |
| JP | 2013-054200 | 3/2013 |
| JP | 2013-057053 | 3/2013 |
| JP | 2014-152274 | 8/2014 |
| KR | 10-2013-0105927 | 9/2013 |
| WO | 2011/108495 | 9/2011 |
| WO | 2012/144521 | 10/2012 |

OTHER PUBLICATIONS

Office Action issued in co-pending U.S. Appl. No. 15/031,647, filed Jan. 16, 2018, 15 pages.
Office Action issued in co-pending U.S. Appl. No. 15/031,647, filed Aug. 8, 2018, 4 pages.
Notice of Allowance issued in co-pending U.S. Appl. No. 15/031,647, filed Jan. 10, 2019, 7 pages.

* cited by examiner

COLOR MATERIAL DISPERSION LIQUID FOR COLOR FILTERS, COLOR MATERIAL, COLOR FILTER, LIQUID CRYSTAL DISPLAY DEVICE AND ORGANIC LIGHT-EMITTING DISPLAY DEVICE

TECHNICAL FIELD

The present disclosure relates to a color material dispersion liquid for color filters, a color material, a color filter, a liquid crystal display device and an organic light-emitting display device.

BACKGROUND ART

Many thin image display devices as typified by displays, i.e., flat panel displays, have been released on the market, because they are thinner than cathode-ray tube displays and they do not occupy much space in depth. Their market price has decreased year by year with advances in production techniques, resulting in a further increase in demand and a yearly increase in production. Especially, color LCD TVs have almost become the mainstream of TVs. Also in recent years, organic light-emitting display devices such as organic EL displays, which emit light by themselves and thereby have high visibility, have received attention as the next generation of image display devices. In relation to the performance of these image display devices, there is a strong demand for a further increase in image quality, such as an increase in contrast and color reproducibility, and a decrease in power consumption.

A color filter is used in these liquid crystal display devices and organic light-emitting display devices. For example, in the case of color LCDs, the amount of light is controlled by using a back light as the light source and electrically driving the liquid crystal. Colors are represented by the light that passed through the color filter. Accordingly, the color filter is indispensable for color representation in LCD TVs and plays a large role in determining display performance. In organic light-emitting display devices, a color image is formed in the same manner as liquid crystal display devices, when the color filter is used in combination with an organic, white light-emitting element.

A recent trend is that there is a demand for power-saving image display devices. To increase backlight use efficiency, there is a very high demand for high-luminance color filters. This is a major issue especially for mobile displays such as mobile phones, smart phones and tablet PCs.

Even though technological advances have increased battery capacity, there is still a limit on battery capacity of mobile devices. Meanwhile, there is a trend that power consumption has grown with the increase in screen size. Image display devices including a color filter determine the design and performance of mobile terminal devices, because they are directly linked to the usable time and charging frequency of mobile terminal devices.

In general, a color filter has a transparent substrate, color layers made of color patterns of the three primary colors (red, green and blue), and a light shielding part formed on the transparent substrate so as to define each color pattern. To form such color layers, a pigment dispersion method in which pigments with excellent heat resistance and light resistance are used as color materials, has been widely used. However, it is difficult for color filters produced by use of pigments to satisfy the latest demand for higher luminance.

As a means to achieve higher luminance, color resin compositions for color filters, which contain dyes, have been studied. Compared to pigments, dyes generally have a higher transmittance and are able to produce a high-luminance color filter. However, dyes are problematic in that they are inferior in heat resistance and light resistance to pigments and the chromaticity is likely to change when they are heated at high temperature in color filter production process, for example. Also, color resin compositions containing dyes have such a problem that aggregates are likely to be precipitated during drying process. Aggregates precipitated in a coating film lead to a remarkable deterioration in contrast and make it difficult to use the coating film as a color layer.

As a method for improving various kinds of resistance properties of dyes, a method for producing a salt-forming dye is known.

In Patent Document 1, a colored photosensitive composition containing a dyed lake pigment is disclosed as a colored photosensitive composition with excellent heat resistance, light resistance, color characteristics and transparency. Also, as the examples of the dyed lake pigment, publicly-known pigments with color index numbers are described.

However, a color layer using the colored photosensitive composition disclosed in Patent Document 1 is insufficient in heat resistance and light resistance.

In Patent Document 2, an acidic dye aluminum lake pigment crystal is disclosed as a pigment with high coloring power and excellent light resistance.

In Patent Document 3, a blue colored composition for color filters, the composition containing a colorant consisting of a copper phthalocyanine blue pigment and a metal lake pigment of a xanthene-based dye, is disclosed as a blue colored composition for color filters, which is able to form a color filter having high luminosity and a wide color reproducing region.

A color filter and so on are disclosed in Patent Document 4 by the inventors of the present invention, which use specific color materials containing divalent or higher anions and divalent or higher cations, in which dye skeletons are crosslinked by crosslinking groups. It is disclosed that the color materials are excellent in heat resistance since, due to containing the divalent or higher anions and the divalent or higher cations, molecular associations are formed therein, and color filters using the color materials have high contrast and are excellent in solvent resistance and electric reliability.

CITATION LIST

Patent Document 1: Japanese Patent Application Laid-Open (JP-A) No. 2001-81348
Patent Document 2: JP-A No. 2006-152223
Patent Document 3: JP-A No. 2010-26334
Patent Document 4: International Publication No. WO2012/144521

SUMMARY OF INVENTION

Technical Problem

Since excellent heat resistance and high luminance can be expected, the inventors of the present invention studied the use of color materials described in Patent Document 4. However, to adjust the color tones of the color materials to desired color tones, it is needed to use the color materials in combination with other color materials.

In the case of using conventionally-used dioxazine-based pigments or phthalocyanine-based pigments as other color materials, due to low transmittance of the pigments, there is a problem of a decrease in luminance. In the case of using dyes, there is a problem of a decrease in heat resistance and light resistance, resulting in a decrease in luminance.

The inventors of the present invention have found that in the case of using an acidic dye aluminum lake pigment disclosed in Patent Document 2, as will be shown in the below-described comparative examples, a decrease in luminance and heat resistance can occur.

Also, the inventors of the present invention have found that in the case of using a lake pigment of a xanthene-based basic dye (e.g., C. I. Pigment Red 81) disclosed in Patent Document 3, as will be shown in the below-described comparative examples, the lake pigment is likely to sublime during a high-temperature heating step in color filter production. Once the pigment sublimes from a color layer of a color filter, there is such a problem that not only the color tone of the color layer changes, but also the sublimed pigment attaches to different color layers and so on and changes the color tone of the different color layers, resulting in a decrease in luminance and occurrence of contamination inside a heating device.

The present invention was achieved in light of the above circumstances. An object of the present invention is to provide: a color material dispersion liquid for color filters, which is able to form a high-luminance coating film with excellent heat resistance; a color material which is inhibited from subliming even when heated at high temperature and which has excellent heat resistance; a high-luminance color filter; a liquid crystal display device including the color filter; and an organic light-emitting display device including the color filter.

Solution to Problem

According to an embodiment of the present invention there is provided a color material dispersion liquid for color filters, containing: (A) a color material, (B) a dispersant and (C) a solvent, wherein the color material (A) contains (A-1) a color material represented by the following general formula (I) and (A-2) a metal lake color material of a rhodamine-based acid dye:

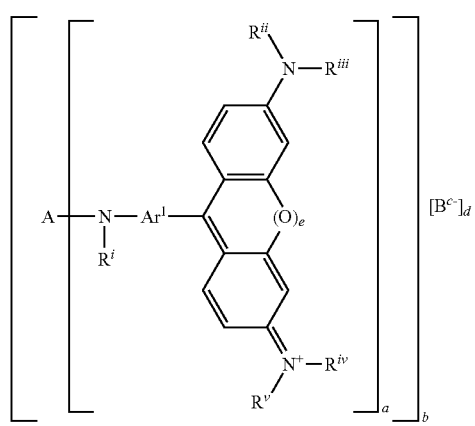

wherein "A" is an "a"-valent organic group in which a carbon atom directly bound to "N" has no r bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of Ar s can be the same or different; "a" and "c" are each an integer of 2 or more, and "b" and "d" are each an integer of 1 or more; "e" is 0 or 1, and there is no bond when "e" is 0; and a plurality of "e"s can be the same or different.

According to an embodiment of the present invention there is provided a color filter including at least a transparent substrate and color layers disposed on the substrate, wherein at least one of the color layers contains (A-1) a color material represented by the following general formula (I) and (A-2) a metal lake color material of a rhodamine-based acid dye:

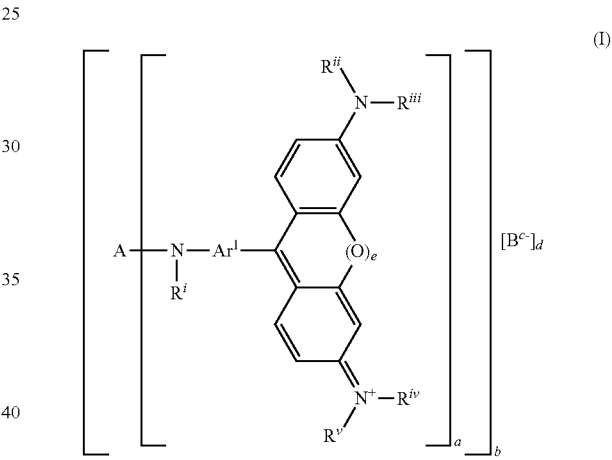

wherein "A" is an "a"-valent organic group in which a carbon atom directly bound to "N" has no r bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of Ar s can be the same or different; "a" and "c" are each an integer of 2 or more, and "b" and "d" are each an integer of 1 or more; "e" is 0 or 1, and there is no bond when "e" is 0; and a plurality of "e"s can be the same or different.

According to an embodiment of the present invention there is provided a liquid crystal display device including the color filter of the present invention, a counter substrate, and a liquid crystal layer disposed between the color filter and the counter substrate.

According to an embodiment of the present invention there is provided an organic light-emitting display device including the color filter of the present invention and an organic light-emitting material.

DESCRIPTION OF EMBODIMENTS

Figure 1:
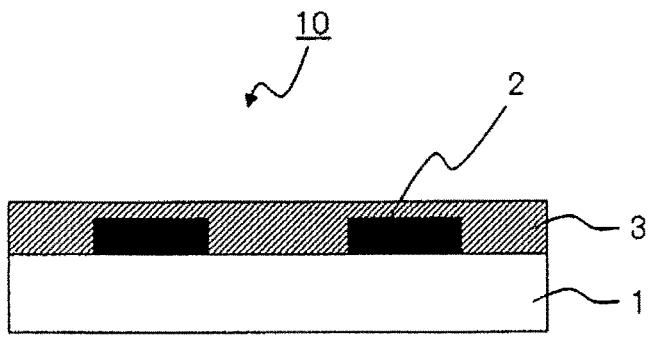
FIG. 1 is a schematic sectional view of an example of the color filter according to an embodiment of the present invention.

Hereinafter, a color material dispersion liquid, a color resin composition for color filters, a color filter, a liquid crystal display device, and an organic light-emitting display device, which are according to some embodiments of the present invention, will be described in order.

In the present disclosure, "light" encompasses electromagnetic waves in visible and non-visible wavelength ranges and radial rays. Radial rays include microwaves and electron beams, more specifically, electromagnetic waves having a wavelength of 5 μm or less and electron beams.

Also in the present disclosure, "(meth)acrylic" means any of acrylic and methacrylic, and "(meth)acrylate" means any of acrylate and methacrylate.

Also in the present disclosure, "organic group" means a group having one or more carbon atoms.

1. Color Material Dispersion Liquid for Color Filters

The color material dispersion liquid according to an embodiment of the present invention is a color material dispersion liquid for color filters, containing: (A) a color material, (B) a dispersant and (C) a solvent, wherein the color material (A) contains (A-1) a color material represented by the following general formula (I) and (A-2) a metal lake color material of a rhodamine-based acid dye:

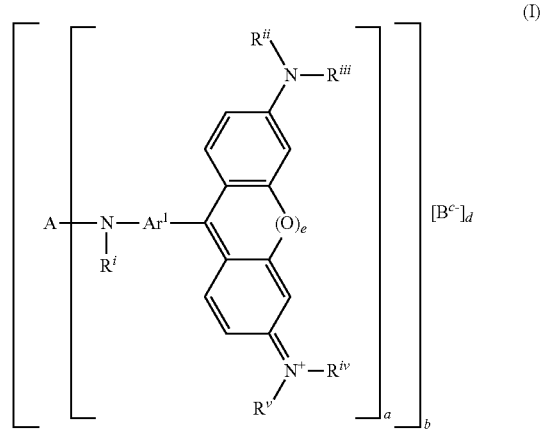

(I)

wherein "A" is an "a"-valent organic group in which a carbon atom directly bound to "N" has no π bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of Ar s can be the same or different; "a" and "c" are each an integer of 2 or more, and "b" and "d" are each an integer of 1 or more; "e" is 0 or 1, and there is no bond when "e" is 0; and a plurality of "e"s can be the same or different.

In the color material dispersion liquid for color filters according to an embodiment of the present invention, the above-specified color materials (A-1) and (A-2) are used in combination as the color material (A), and the color material (A) is dispersed in the solvent (C). Therefore, the color material dispersion liquid becomes a color material dispersion liquid which is able to form a high-luminance coating film with excellent heat resistance, with adjusting the color tone of the coating film to a desired color tone.

The mechanism that the above-described effect is exerted by the above-specified combination is not clear yet; however, it is presumed as follows.

The color material (A-1) is a color material which has a structure represented by the general formula (I) and in which divalent or higher cations and divalent or higher polyoxometalate anions form salts. The cation in the general formula (I) has a plurality of color-forming moieties, and the color-forming moieties have a similar basic skeleton to that of basic dyes. Therefore, as with conventional dyes, the cation in the general formula (I) has excellent transmittance; meanwhile, the cation has a higher molecular weight and better heat resistance than conventional basic dyes. In Patent Document 4, it is disclosed by the inventors of the present invention that molecular associations are formed by combining divalent or higher cations and divalent or higher anions in the color material represented by the general formula (I), resulting in further increase in heat resistance.

Meanwhile, the inventors of the present invention have found that in the case of using a xanthene-based dye in a color layer of a color filter, even if the xanthene-based dye is laked, the xanthene-based dye can sublime during a high-temperature heating step in color filter production. In light of this finding, the inventors of the present invention made more research and have found the following: among xanthene-based dyes, a metal lake color material of a fluorescein-based dye or rhodamine-based basic dye is likely to sublime; however, in the case of using a metal lake color material of a rhodamine-based acid dye, the color material is less likely to sublime.

The rhodamine-based acid dye is a derivative of 6-aminoxanthene-3-imine, and it is such an anionic dye that it has a structure in which at least two hydrogen atoms per molecule are substituted with substituent groups having at least one of acidic groups (e.g., a sulfo group and a carboxy group) and salts thereof.

It is presumed that such a rhodamine-based acid dye is stabilized to provide excellent heat resistance, since the imine (which is cationic) and the acidic group (which is anionic) form an intramolecular salt (betaine) structure. Also, since the rhodamine-based acid dye has at least one anionic acidic group, in addition to the intramolecular salt structure per molecule, it is presumed that when the rhodamine-based acid dye is laked with metal cations and dispersed as particles in a solvent, a strong electrical or acid-base interaction occurs both inside and between the molecules of the rhodamine-based dye, thus obtaining excellent heat resistance and inhibiting sublimation.

The rhodamine-based acid dye is a skeleton having an amino group as a substituent group, and it is a skeleton that is similar to the color-forming moiety of the color material represented by the general formula (I), that is, a triarylmethane or xanthene skeleton having an amino group as a substituent group. Accordingly, the rhodamine-based acid dye has such a spectral characteristic that, as with the color material represented by the general formula (I), the transmittance in a wavelength range of 400 to 450 nm is high. Therefore, the use of the combination of the metal lake pigment of the rhodamine-based acid dye and the color material (A-1) is advantageous in that a high-luminance color filter is easily obtained, without any deterioration in the high transmittance of the color material (A-1).

Due to the above reasons, by the use of the combination of the color material (A-1) and the color material (A-2), a color material dispersion liquid which is able to form a high-luminance coating film with excellent heat resistance, with adjusting the color tone of the coating film to a desired color tone, can be obtained.

The color material dispersion liquid for color filters according to an embodiment of the present invention contains at least the color material (A), the dispersant (B) and the solvent (C). It can further contain other components, as long as the effect of the present invention is not impaired. Hereinafter, the components of the color material dispersion liquid for color filters according to an embodiment of the present invention, will be described in detail.

[Color Material (A)]

The color material (A) used for the color material dispersion liquid according to an embodiment of the present invention contains at least a color material (A-1) represented by the following general formula (I) and a metal lake color material (A-2) of a rhodamine-based acid dye:

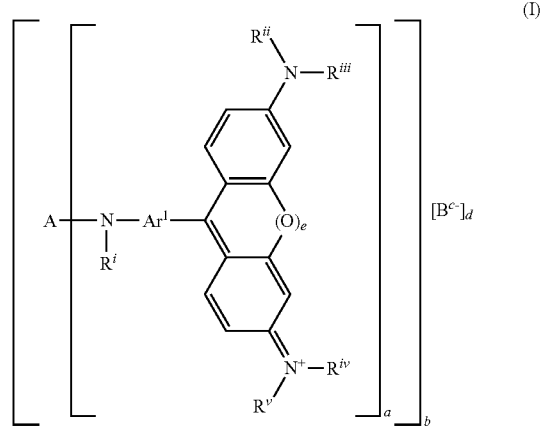

(symbols in the general formula (I) are as described above.)

<Color Material (A-1)>

In the general formula (I), "A" is an "a"-valent organic group in which a carbon atom directly bound to "N" (nitrogen atom) has no n bond. The organic group is an aliphatic hydrocarbon group having a saturated aliphatic hydrocarbon group at least at a terminal position directly bound to "N", or an aromatic group having the aliphatic hydrocarbon group, and O (oxygen atom), S (sulfur atom), N (nitrogen atom) can be contained in a carbon chain of the organic group. Since the carbon atom directly bound to "N" has no n bond, the color characteristics of the cationic color-forming moiety, such as color tone and transmittance, are not affected by the linking group A and other color-forming moieties, thereby allowing the same color as that of a single color-forming moiety.

In "A", as long as the carbon atom being at the terminal position and directly bound to "N" has no n bond, the aliphatic hydrocarbon group having a saturated aliphatic hydrocarbon group at least at a terminal position directly bound to "N", can be in a straight-chain, branched-chain or cyclic form, have an unsaturated bond in carbon atoms except the one in the terminal position, have a substituent group, or contain O, S, N in the carbon chain. For example, a carbonyl group, a carboxyl group, an oxycarbonyl group and/or an amide group can be contained, and a hydrogen atom can be substituted by a halogen atom, etc.

Also in "A", as the aromatic group having an aliphatic hydrocarbon group, there may be exemplified a monocyclic or polycyclic aromatic group which has an aliphatic hydrocarbon group having a saturated aliphatic hydrocarbon group at least at the terminal position directly bound to "N". The aromatic group can have a substituent group, and it can be a heterocyclic ring containing O, S, N.

Particularly, from the viewpoint of skeleton toughness, it is preferable that "A" contains a cyclic aliphatic hydrocarbon group or an aromatic group.

As the cyclic aliphatic hydrocarbon group, a bridged alicyclic hydrocarbon group is particularly preferred from the viewpoint of skeleton toughness. The bridged alicyclic hydrocarbon group refers to a polycyclic aliphatic hydrocarbon group having a bridged structure in the aliphatic ring and having a polycyclic structure. The examples include norbornane, bicyclo[2,2,2]octane and adamantane. Of bridged alicyclic hydrocarbon groups, norbornane is preferred. Examples of the aromatic group include groups containing a benzene ring and those containing a naphthalene ring. Of them, groups containing a benzene ring are preferred.

From the viewpoint of ease of availability of raw materials, "A" is preferably divalent. For example, when "A" is a divalent organic group, examples of the divalent organic group include a straight-chain, branched-chain or cyclic alkylene group having 1 to 20 carbon atoms, and an aromatic group in which two alkylene groups each having 1 to 20 carbon atoms are bound by substitution, such as a xylylene group.

The alkyl group as each of $R^i$ to $R^v$ is not particularly limited. Examples of the alkyl group include a straight- or branched-chain alkyl group having 1 to 20 carbon atoms. Of them, preferred is a straight- or branched-chain alkyl group having 1 to 8 carbon atoms, and more preferred is a straight- or branched-chain alkyl group having 1 to 5 carbon atoms, from the viewpoint of ease of production and availability of raw materials. Of them, still more preferred is an ethyl group or a methyl group. A substituent group that the alkyl group can have is not particularly limited. The examples include an aryl group, a halogen atom and a hydroxyl group. As the substituted alkyl group, a benzyl group can be exemplified.

The aryl group as each of $R^i$ to $R^v$ is not particularly limited. The examples include a phenyl group and a naphthyl group. As a substituent group that the aryl group can have, an alkyl group and a halogen atom can be exemplified.

"$R^{ii}$ and $R^{iii}$ can be bound to form a ring structure, and/or $R^{iv}$ and $R^v$ can be bound to form a ring structure" means that $R^{ii}$ and $R^{iii}$ form a ring structure through a nitrogen atom, and/or $R^{iv}$ and $R^{ii}$ form a ring structure through a nitrogen atom. The ring structure is not particularly limited, and the examples include a pyrrolidine ring, a piperidine ring and a morpholine ring.

Particularly, from the viewpoint of chemical stability, it is preferable that each of $R^i$ to $R^v$ is independently a hydrogen atom, an alkyl group having 1 to 5 carbon atoms, or a phenyl group. Or, it is preferable that $R^{ii}$ and $R^{iii}$ are bound to form a pyrrolidine ring, a piperidine ring or a morpholine ring, and/or $R^{iv}$ and $R^v$ are bound to form a pyrrolidine ring, a piperidine ring or a morpholine ring.

Each of $R^i$ to $R^v$ can independently have the above structure. Particularly, from the viewpoint of color purity, it is preferable that $R^i$ is a hydrogen atom. From the viewpoint of ease of production and availability of raw materials, it is more preferable that all of $R^{ii}$ to $R^v$ are the same.

The divalent aromatic group as $Ar^1$ is not particularly limited. The aromatic group can be an aromatic hydrocarbon group composed of a carbon ring, or a heterocyclic group. Examples of the aromatic hydrocarbon in the aromatic hydrocarbon group include: a benzene ring; condensed polycyclic aromatic hydrocarbons such as a naphthalene ring, a tetralin ring, an indene ring, a fluorene ring, an anthracene ring and a phenanthrene ring; and chain polycyclic hydrocarbons such as biphenyl, terphenyl, diphenylmethane, triphenylmethane and stilbene. The chain polycyclic hydrocarbons can have O, S, N in the chain skeleton, such as diphenyl ether. Meanwhile, examples of the heterocyclic ring in the heterocyclic group include: 5-membered heterocyclic rings such as furan, thiophene, pyrrole, oxazole, thiazole, imidazole and pyrazole; 6-membered heterocyclic rings such as pyran, pyrone, pyridine, pyrone, pyridazine, pyrimidine and pyrazine; and condensed polycyclic heterocyclic rings such as benzofuran, thionaphthene, indole, carbazole, coumarin, benzo-pyrone, quinoline, isoquinoline, acridine, phthalazine, quinazoline and quinoxaline. These aromatic groups can have a substituent group.

Examples of the substituent group that the aromatic group can have include an alkyl group having 1 to 5 carbon atoms and a halogen atom.

$Ar^1$ is preferably an aromatic group having 6 to 20 carbon atoms, more preferably an aromatic group having a condensed polycyclic carbon ring having 10 to 14 carbon atoms. Still more preferred are a phenylene group and a naphthylene group, from the point of view that the structure is simple and the raw materials are low-cost.

A plurality of $R^i$s per molecule can be the same or different; a plurality of $R^{ii}$s per molecule can be the same or different; a plurality of $R^{iii}$s per molecule can be the same or different; a plurality of $R^{iv}$s per molecule can be the same or different; a plurality of $R^v$s per molecule can be the same or different; and a plurality of Ar s per molecule can be the same or different. The color-forming moieties show the same color when, in all of the moieties, $R^i$s are the same; $R^{ii}$s are the same; $R^{iii}$s are the same; $R^{iv}$s are the same; $R^v$s are the same; and $Ar^1$s are the same. In this case, therefore, the color material can reproduce the same color as that of a single color-forming moiety, which is preferred from the viewpoint of color purity. On the other hand, in the case where at least one of $R^i$ to $R^v$ and $Ar^1$ is a different substituent group, it is possible to reproduce a color obtained from a mixture of several kinds of color-forming moieties, so that it is possible to produce a desired color.

The anion ($B^{c-}$) in the color material (A-1) is a divalent or higher polyoxometalate anion. The polyoxometalate anion can be isopolyoxometalate ion $(M_mO_n)^{d-}$ or heteropolyoxometalate ion $(X_1M_mO_n)^{d-}$. In the ionic formulae, "M" is a polyatom; "X" is a heteroatom; "m" is the compositional ratio of the polyatom; and "n" is the compositional ratio of an oxygen atom. As the polyatom (M), there may be mentioned Mo, W, V, Ti, Nb, etc. As the heteroatom (X), there may be mentioned Si, P, As, S, Fe, Co, etc. A counter cation such as $Na^+$ or $H^+$ can be contained in a part of the polyoxometalate anion.

From the viewpoint of high luminance and excellent heat resistance and light resistance, preferred is a polyoxometalate anion containing at least one of tungsten (W) and molybdenum (Mo). From the viewpoint of heat resistance, more preferred is a polyoxometalate anion which contains at least tungsten and can contain molybdenum.

As the polyoxometalate anion containing at least one of tungsten (W) and molybdenum (Mo), for example, there may be mentioned a tungstate ion $[W_{10}O_{32}]^{4-}$ and a molybdate ion $[Mo_6O_{19}]^{2-}$, which are isopolyoxometalates, and phosphotungstate ions $[PW_{12}O_{40}]^{3-}$ and $[P_2W_{18}O_{62}]^{6-}$, a silicotungstate ion $[SiWi_2O_{40}]^{4-}$, a phosphomolybdate ion $[PMo_{12}O_{40}]^{3-}$, a silicomolybdate ion $[SiMo_{12}O_{40}]^{4-}$, phosphotungstic molybdate ions $[PW_{12-x}Mo_xO_{40}]^{3-}$ (x is an integer of 1 to 11) and $[P_2W_{18-y}Mo_yO_{62}]^{6-}$ (y is an integer of 1 to 17) and a silicotungstic molybdate ion $[SiW_{12-x}Mo_xO_{40}]^{4-}$ (x is an integer of 1 to 11), which are all heteropolyoxometalates. Of these examples, from the viewpoint of heat resistance and availability of raw materials, the polyoxometalate anion containing at least one of tungsten (W) and molybdenum (Mo) is preferably a heteropolyoxometalate, more preferably a heteropolyoxometalate containing phosphorus (P).

In the polyoxometalate anion containing at least tungsten (W), the content ratio of the tungsten to molybdenum is not particularly limited. Particularly from the viewpoint of excellent heat resistance, the molar ratio of the tungsten to molybdenum is preferably 100:0 to 85:15, more preferably 100:0 to 90:10.

As the polyoxometalate anion (B'), the above-mentioned polyoxometalate anions can be used alone or in combination of two or more kinds. In the case of using a combination of two or more kinds of the above-mentioned polyoxometalate anions, the molar ratio of the tungsten to molybdenum in the whole polyoxometalate anion is preferably in the above range.

(Other Ions)

The color material (A-1) represented by the general formula (I) can be a double salt that further contains other cation or anion, to the extent that does not impair the effect of the present invention. Concrete examples of such a cation include: other basic dyes; organic compounds containing a functional group which is able to form a salt with an anion, such as an amino group, pyridine group or imidazole group; and metal ions such as a sodium ion, potassium ion, magnesium ion, calcium ion, copper ion and iron ion. Concrete examples of such an anion include halide ions such as a fluoride ion, chloride ion and bromide ion, and inorganic acid anions. Examples of the inorganic acid anions include oxo acid anions such as a phosphate ion, sulfate ion, chromate ion, tungstate ion ($WO_4^{2-}$) and molybdate ion ($MoO_4^{2-}$).

<Color Material (A-2)>

The color material dispersion liquid according to an embodiment of the present invention contains the metal lake color material (A-2) of a rhodamine-based acid dye, as a color material.

In an embodiment of the present invention, the rhodamine-based acid dye is a derivative of 6-aminoxanthene-3-imine, and it is such an anionic dye that it has a structure in which at least two hydrogen atoms per molecule are substituted with substituent groups having at least one of acidic groups (e.g., a sulfo group and a carboxy group) and salts thereof. Therefore, the metal lake color material (A-2) of the rhodamine-based acid dye is a lake color material formed by the anion of the rhodamine-based acid dye and the cation of the metal laking agent.

The rhodamine-based acid dye contains a cationic imine moiety and is anionic as a whole molecule. Therefore, the rhodamine-based acid dye usually contains two or more substituent groups having at least one of the acidic groups and salts thereof per molecule and has at least a pair of intramolecular salts (betaine structure).

In an embodiment of the present invention, such a rhodamine-based acid dye is metal-laked for use; therefore, in either a solvent or coating film, the lake color material is dispersed in the form of fine particles. The dye in the fine particles aggregates at the molecular level, while forming a salt with the laking agent. It is considered that in an embodiment of the present invention, owing to the betaine structure in each molecule of the rhodamine-based acid dye, a stronger electrical interaction, acid-base interaction or the like occurs both inside and between the molecules of the rhodamine-based dye, thus obtaining the lake color material having better heat resistance and being inhibited from subliming.

The rhodamine-based acid dye preferably has a phenyl group at the 9-position of the xanthene skeleton. The structure represented by the following general formula (III) is preferably used as the rhodamine-based acid dye:

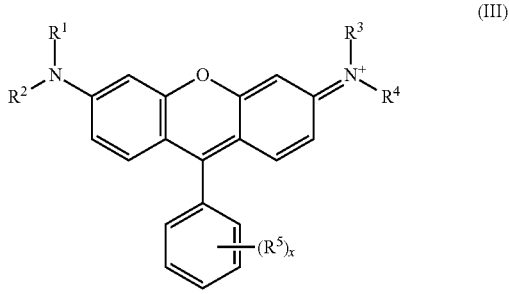

(III)

wherein each of $R^1$, $R^2$, $R^3$ and $R^4$ is independently a hydrogen atom, an alkyl group, an aryl group or a heteroaryl group; $R^1$ and $R^2$ can be bound to form a ring structure, and/or $R^3$ and $R^4$ can be bound to form ring structure; $R^1$ and a carbon atom at the 5-position of the xanthene ring, $R^2$ and a carbon atom at the 7-position of the xanthene ring, $R^3$ and a carbon atom at the 4-position of the xanthene ring, or $R^4$ and a carbon atom at the 2-position of the xanthene ring can be bound to form a ring structure; the hydrogen atom in the aryl or heteroaryl group can be substituted with an acidic group or a salt thereof, or with a halogen atom; $R^5$ is an acidic group or a salt thereof; "x" is an integer of 0 to 5; and the general formula (III) has at least two acidic groups or salts thereof, and one of the at least two acidic groups or salts thereof forms an intramolecular salt.

The alkyl group as $R^1$ to $R^4$ is preferably a straight- or branched-chain alkyl group which has 1 to 20 carbon atoms and which can have a substituent group, more preferably a straight- or branched-chain alkyl group which has 1 to 8 carbon atoms and which can have a substituent group, still more preferably a straight- or branched-chain alkyl group which has 1 to 5 carbon atoms and which can have a substituent group. The substituent group that the alkyl group can have is not particularly limited. The examples of the substituent include an aryl group and a halogen atom, and the aryl group can further have a halogen atom or an acidic group or a salt thereof, as a substituent group.

The aryl group as $R^1$ to $R^4$ is preferably an aryl group which has 6 to 20 carbon atoms and which can have a substituent group, more preferably a group which has a phenyl group, a naphthyl group, etc.

The heteroaryl group as $R^1$ to $R^4$ is preferably a heteroaryl group which has 5 to 20 carbon atoms and which can have a substituent group, and it is preferably one having a nitrogen atom, an oxygen atom and/or a sulfur atom as a heteroatom.

Examples of the substituent group that the aryl or heteroaryl group can have include an alkyl group having 1 to 5 carbon atoms, a halogen atom, an acidic group or a salt thereof, a hydroxyl group, an alkoxy group, a nitrile group, a carbamoyl group and a carboxylic acid ester group.

"$R^1$ and $R^2$ are bound to form a ring structure, and/or $R^3$ and $R^4$ are bound to form a cyclic structure" means that $R^1$ and $R^2$ form a ring structure through a nitrogen atom, and/or $R^3$ and $R^4$ form a ring structure through a nitrogen atom. The ring structure is not particularly limited. The examples include 5- to 7-membered, nitrogen-containing heterocyclic rings. The concrete examples include a pyrrolidine ring, a piperidine ring and a morpholine ring.

"$R^1$ and a carbon atom at the 5-position of the xanthene ring, $R^2$ and a carbon atom at the 7-position of the xanthene ring, $R^3$ and a carbon atom at the 4-position of the xanthene ring, or $R^4$ and a carbon atom at the 2-position of the xanthene ring are bound to form a ring structure" means that a combination of any one of $R^1$ to $R^4$ and a carbon atom at a given position of the xanthene ring each form a ring structure through a nitrogen atom and a part of the xanthene skeleton. The ring structure is not particularly limited; however, the examples of the ring structure include 5- to 7-membered, nitrogen-containing heterocyclic rings.

Concrete examples of the acidic group or salt thereof include a carboxy group (—COOH), a carboxylato group (—COO), a carboxylic acid salt group (—COOM where "M" is a metal atom), a sulfonato group (—$SO_3^-$), a sulfo group (—$SO_3H$) and a sulfonic acid salt group (—$SO_3M$ where "M" is a metal atom). It is preferable to have at least one of a sulfonato group (—$SO_3^-$), a sulfo group (—$SO_3H$) and a sulfonic acid salt group (—$SO_3M$). Examples of the metal atom M include a sodium atom and a potassium atom.

Concrete examples of the rhodamine-based acid dye include Acid Red 50, Acid Red 52, Acid Red 289, Acid Violet 9, Acid Violet 30 and Acid Blue 19.

In an embodiment of the present invention, a laking agent containing a metal atom is used for the metal lake color material of the rhodamine-based acid dye. By the use of the laking agent containing a metal atom, the color material obtains better heat resistance. Such a laking agent is preferably a laking agent containing a metal atom that will be a divalent or higher metal cation. Concrete examples thereof include barium chloride, calcium chloride, calcium carbonate, aluminum chloride, aluminum sulfate, aluminum acetate, lead acetate, magnesium sulfate, zirconium chloride, zirconium sulfate, zirconium carbonate, polyaluminum chloride and polyaluminum sulfate. Particularly preferred is a laking agent containing a metal atom that will be a trivalent or higher metal cation. In an embodiment of the present invention, the laking agent is preferably a laking agent containing aluminum, from the viewpoint of ease of synthesis of the laked color material and excellent dispersibility of the lake color material. That is, the color material used in an embodiment of the present invention is preferably an aluminum lake color material of a rhodamine-based acid dye.

By the use of the laking agent containing aluminum that will be a trivalent cation, it is presumed that the laking agent has stronger cohesive force, compared to a laking agent containing a metal atom that will be a divalent metal cation. Therefore, the solubility of the laked rhodamine-based acid dye in solvent is largely decreased, and the nature of the rhodamine-based acid dye becomes closer to the nature of pigments. Therefore, there are such advantages that the color material obtains excellent dispersibility and heat resistance, and it is easy to collect the laked color material in color material production (by filtration).

The laking agent containing aluminum is particularly preferably a polyaluminum chloride represented by the following general formula (II), from the point of view that the color material obtains excellent heat resistance and is inhibited from subliming:

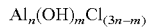
General Formula (II):

wherein "n" is an integer of 2 to 20, and "m" is an integer of (n/2) to (3n−1).

That is, the color material according to an embodiment of the present invention is the metal lake color material of the rhodamine-based acid dye, and the laking agent is the polyaluminum chloride represented by the general formula (II).

For the polyaluminum chloride represented by the general formula (II), as the number of hydroxy groups increases, the cationic valence of the whole polyaluminum chloride decreases. However, since the nature as aluminum hydroxide becomes stronger, the cohesive force as laking agent is presumed to be stronger. Therefore, it is presumed that even if the cationic valence of the polyaluminum chloride as a whole is 1, the polyaluminum chloride can be used as a laking agent with strong cohesive force, and the thus-obtained lake color material also becomes a stronger color material by hydrogen bonding of aluminum hydroxides in the cationic parts. As the cationic valence of the whole polyaluminum chloride decreases, a laking reaction with the rhodamine-based acid dye is likely to proceed uniformly, so that the laked color material obtains a uniform particle size distribution and excellent dispersibility. In contrast, if the cationic valence of the whole polyaluminum chloride is too large, the reaction with the rhodamine-based acid dye does not completely proceed and, as a result, the laked color material may obtain a non-uniform particle size distribution and poor dispersibility.

Due to the above reasons, by the use of the polyaluminum chloride represented by the general formula (II), the color material obtains better heat resistance and is more inhibited from subliming.

In the polyaluminum chloride represented by the general formula (II), "n" is the number of aluminum atoms and is 2 to 20. By the use of the polyaluminum chloride having 2 to 20 aluminum atoms, which is a relatively small number, as the laking agent, the dispersed particle diameter of the color material (A-2) does not become too large, so that the color material (A-2) obtains excellent dispersibility.

In an embodiment of the present invention, "n" is preferably an integer of 2 to 10.

In the polyaluminum chloride represented by the general formula (II), "m" is the number of hydroxy groups (OH groups) and is an integer of (n/2) to (3n−1). When "n" is an odd number, the lower limit of "m" is {(n+1)/2}, which is the minimum integer in the range.

In the polyaluminum chloride, the aluminum has trivalent cationic property, and the hydroxy groups have monovalent anionic property. Therefore, the polyaluminum chloride has (3n−m)-valent cationic property, as a whole.

In an embodiment of the present invention, from the point of view that the color material has strong cohesive force, is easy to collect, and has excellent dispersibility, the polyaluminum chloride preferably has higher basicity, and "m" is preferably an integer of 2n to (3n−1).

For the polyaluminum chloride represented by the general formula (II), from the point of view that the dispersibility of the color material and the contrast of the coating film are increased, "n" is preferably an integer of 2 to 10, and "m" is preferably an integer of 2n to (3n−1).

That is, it is more preferable that the color material according to an embodiment of the present invention is a metal lake color material of a rhodamine-based acid dye, and a laking agent is a polyaluminum chloride represented by the following general formula (II'):

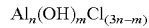
General Formula (II'):

wherein "n" is an integer of 2 to 10, and "m" is an integer of 2n to (3n−1).

Also, for the polyaluminum chloride represented by the general formula (II) or (II'), the basicity defined by {(m/3n)×100(%)} is preferably 15 to 99%, more preferably 60 to 97%, still more preferably 70 to 95%, from the following points of view: the heat resistance of the color material is more increased; it is easy to inhibit the color material from subliming; and it is easy to impart excellent dispersibility to the color material.

The metal lake color material of the rhodamine-based acid dye can be obtained by mixing a desired rhodamine-based acid dye and a desired laking agent containing a metal atom in a solvent. In particular, for example, there may be mentioned the following methods: (1) a method in which a desired rhodamine-based acid dye and a desired laking agent containing a metal atom, are added to a solvent in which the dye and the laking agent are soluble, and they are stirred and mixed together, with heating or cooling as needed; and (2) a method in which a desired rhodamine-based acid dye solution and a desired laking agent solution containing a metal atom are separately prepared, and the dye solution and the laking agent solution are mixed together, with heating or cooling as needed.

At the time of laking, the heating temperature is not particularly limited. When water is used as the solvent, the heating temperature can be 5 to 90° C.

The rhodamine-based acid dye can be synthesized by reference to known synthesis methods, such as the synthesis method described in "Shin senryo kagaku" (author: Yutaka Hosoda, publisher: Gihodo Shuppan Co., Ltd.) Or, a commercially-available product can be used as the rhodamine-based acid dye.

<Other Color Material>

In order to adjust color tone, the color material (A) can further contain other color material, to the extent that does not impair the effects of the present invention. As the other color material, there may be mentioned known pigments and dyes, etc. The other color material is not particularly limited, as long as the effects of the present invention are not impaired, and can be the same as the case of the below-described color resin composition for color filters.

In an embodiment of the present invention, the average dispersed particle diameter of the color material (A) used is not particularly limited, as long as a desired color can be obtained when the color material is formed into the color layer of a color filter. From the viewpoint of increasing contrast and obtaining excellent heat resistance and light resistance, the average dispersed particle diameter is preferably in a range of 10 to 200 nm, more preferably in a range of 20 to 150 nm. By setting the average dispersed particle diameter of the color material (A) within the range, the liquid crystal display device and organic light-emitting display device produced by the use of the color resin composition for color filters according to an embodiment of the present invention, can have high contrast and high quality.

The average dispersed particle diameter of the color material (A) in the color material dispersion liquid is the dispersed particle diameter of the color material particles dispersed in a dispersion medium that contains at least a solvent, and it is measured with a laser scattering particle size distribution analyzer. The average dispersed particle diameter can be measured as follows with a laser scattering particle size distribution analyzer: the color material dispersion liquid is appropriately diluted with the solvent used for the color material dispersion liquid to a concentration that is measurable with a laser scattering particle size distribution analyzer (e.g., 1,000-fold) and then measured with a laser scattering particle size distribution analyzer (e.g., Nanotrac Particle Size Analyzer UPA-EX150 manufactured by Nikkiso Co., Ltd.) by a dynamic light scattering method at 23° C. This average dispersed particle diameter is a volume average particle diameter.

In the color material dispersion liquid according to an embodiment of the present invention, the content of the color material is not particularly limited. From the viewpoint of dispersibility and dispersion stability, the content of the color material is preferably in a range of 5 to 40% by mass, more preferably in a range of 10 to 20% by mass, with respect to the total amount of the color material dispersion liquid.

Also in the color material dispersion liquid according to an embodiment of the present invention, the mixing ratio of the color material (A-1) to the color material (A-2) can be appropriately determined, in order to obtain a desired color tone, and it is not particularly limited. From the viewpoint of heat resistance, the mass ratio of the color material (A-1) to the color material (A-2) is preferably 50:50 to 99:1, more preferably 70:30 to 95:5.

[(B) Dispersant]

In the color material dispersion liquid according to an embodiment of the present invention, the color material (A) is dispersed in the solvent by the dispersant (B) for use. The dispersant (B) can be appropriately selected from those that are conventionally used as dispersants. Concrete examples of the dispersant include surfactants such as cationic, anionic, nonionic, amphoteric, silicone-based and fluorine-based surfactants. Among surfactants, polymer surfactants (polymer dispersants) are preferred from the viewpoint of being able to disperse the color material homogeneously and finely.

Examples of polymer dispersants include: (co)polymers of unsaturated carboxylic acid esters such as polyacrylic acid ester; (partial) amine salts, (partial) ammonium salts and (partial) alkylamine salts of (co)polymers of unsaturated carboxylic acids such as polyacrylic acid; (co)polymers of hydroxyl group-containing unsaturated carboxylic acid esters such as hydroxyl group-containing polyacrylic acid ester, and modified products thereof; polyurethanes; unsaturated polyamides; polysiloxanes; long-chain polyaminoamide phosphates; polyethyleneimine derivatives (amide and bases thereof, obtained by reaction of poly(lower alkyleneimine) and polyester having a free carboxyl group); and polyallylamine derivatives (reaction products obtained by reaction of polyallylamine and one or more compounds selected from the group consisting of the following three kinds of compounds: polyester having a free carboxyl group, polyamide, and a co-condensate of ester and amide (polyester amide)).

Commercially-available products of such dispersants include Disperbyk-2000 and 2001, and BYK-LPN 6919 and 21116 (all manufactured by BYK Japan KK), AJISPER PB821 and 881 (manufactured by Ajinomoto Co., Inc.) and so on. Of them, BYK-LPN 6919 and 21116 are preferred from the viewpoint of heat resistance, electric reliability and dispersibility.

From the point of view that appropriate dispersion of the color material (A) and excellent dispersion stability can be achieved, the polymer dispersant is particularly preferably one or more kinds selected from the group consisting of a polymer having at least a constitutional unit represented by the following general formula (IV) and urethane-based dispersants composed of compounds having one or more urethane bonds (—NH—COO—) per molecule.

Hereinafter, the preferred dispersant will be described in detail.

<Polymer Having at Least a Constitutional Unit Represented by the Following General Formula (IV)>

In an embodiment of the present invention, a polymer having at least a constitutional unit represented by the following general formula (IV) can be preferably used as the dispersant (B):

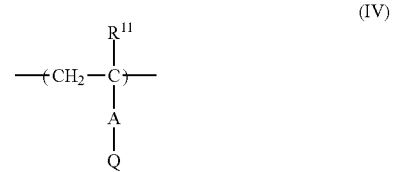

wherein $R^{11}$ is a hydrogen atom or a methyl group; "A" is a direct bond or a divalent linking group; "Q" is a group represented by the following general formula (IV-a) or a nitrogen-containing heterocyclic group which is able to form a salt and which can have a substituent group:

wherein each of $R^{12}$ and $R^{13}$ is independently a hydrogen atom or a hydrocarbon group which can contain a heteroatom, and $R^{12}$ and $R^{13}$ can be the same or different from each other.

In the general formula (IV), "A" is a direct bond or a divalent linking group. The direct bond means that "Q" is directly bound to a carbon atom in the general formula (IV), not through a linking group.

Examples of the divalent linking group as "A" include an alkylene group having 1 to 10 carbon atoms, an arylene group, a —CONH— group, a —COO— group, an ether group having 1 to 10 carbon atoms (—R'—OR"— where each of R' and R" is independently an alkylene group) and combinations thereof.

From the viewpoint of dispersibility, "A" in the general formula (IV) is preferably a direct bond or a divalent linking group containing a —CONH— group or a —COO— group.

The above dispersants can be particularly preferably used by allowing the constitutional unit represented by the general formula (IV) of the dispersants to form a salt by the below-described salt forming agent, at a desired ratio.

As the polymer having the constitutional unit represented by the general formula (IV), block and graft copolymers having structures disclosed in International Publication No. WO2011/108495 and Japanese Patent Application Laid-Open (JP-A) Nos. 2013-054200, 2010-237608 and 2011-75661 are particularly preferred, from the point of view that the dispersibility and dispersion stability of the color material and the heat resistance of the resin composition can be increased, and a color layer with high luminance and high contrast can be formed.

Commercially-available products of the polymers having the constitutional unit represented by the general formula (IV) include BYK-LPN 6919.

(Salt Forming Agent)

In an embodiment of the present invention, the dispersant is preferably a polymer in which at least a part of a nitrogen site of the constitutional unit represented by the general formula (IV) forms a salt (hereinafter, this state may be referred to as "salt-modified").

In an embodiment of the present invention, by allowing the nitrogen site of the constitutional unit represented by the general formula (IV) to form a salt using the salt forming agent, the dispersant strongly adsorbs to the color material similarly forming a salt, so that the dispersibility and dispersion stability of the color material are increased. As the salt forming agent, acidic organophosphorus compounds, organic sulfonic acid compounds and quaternizing agents, which are disclosed in International Publication No. WO2011/108495 and JP-A No. 2013-054200, can be preferably used. Especially when the salt forming agent is an acidic organophosphorus compound, salt-forming moieties containing the acidic organophosphorus compound of the dispersant are localized on the surface of the color material particles, and thus the color material surface reaches a state of being covered with phosphate. Therefore, attacks on the dye skeleton of the color material by active oxygen (hydrogen abstraction) are inhibited, so that the heat resistance and light resistance of the color material containing the dye skeleton are increased. For this reason, color deterioration by high-temperature heating can be further inhibited by the use of the polymer salt-modified by the acidic organophosphorus compound as the dispersant, while the color material (A) having high transmittance and being used in an embodiment of the present invention is in a state of being sufficiently dispersed. Therefore, a color layer which shows higher luminance even after it undergoes the high-temperature heating of the color filter production step, can be formed.

<Urethane-Based Dispersant>

The urethane-based dispersant which is preferably used as the dispersant, is a dispersant composed of a compound having one or more urethane bonds (—NH—COO—) per molecule.

Excellent dispersion is possible by the use of a small amount of the urethane-based dispersant. By making the amount of the dispersant small, the amount of a cure component, etc., can be relatively large. As a result, a color layer with excellent heat resistance can be formed.

In an embodiment of the present invention, the urethane-based dispersant is preferably a reaction product of (1) polyisocyanates having two or more isocyanate groups per molecule and (2) one or more kinds selected from polyesters having a hydroxyl group at a single terminal or both terminals thereof and poly(meth) acrylates having a hydroxyl group at a single terminal or both terminals thereof. The urethane-based dispersant is more preferably a reaction product of (1) polyisocyanates having two or more isocyanate groups per molecule, (2) one or more kinds selected from polyesters having a hydroxyl group at a single terminal or both terminals thereof and poly(meth) acrylates having a hydroxyl group at a single terminal or both terminals thereof, and (3) a compound having an active hydrogen and a basic or acidic group per molecule.

Examples of commercially-available, urethane-based dispersants include Disperbyk-161, 162, 163, 164, 167, 168, 170, 171, 174, 182, 183, 184 and 185, and BYK-9077 (all manufactured by BYK Japan KK), AJISPER PB711 (manufactured by Ajinomoto Co., Inc.) and EFKA-46, 47 and 48 (manufactured by EFKA CHEMICALS). Of them, Disperbyk-161, 162, 166, 170 and 174 are preferred from the viewpoint of heat resistance, electric reliability and dispersibility.

As the dispersant (B), these dispersants can be used alone or in combination of two or more kinds.

In the color material dispersion liquid according to an embodiment of the present invention, from the viewpoint of dispersibility and dispersion stability, the content of the dispersant (B) is generally preferably in a range of 1 to 50% by mass, more preferably in a range of 1 to 20% by mass, with respect to the total amount of the dispersion liquid.

[(C) Solvent]

In an embodiment of the present invention, the solvent (C) can be appropriately selected from solvents which are unreactive with components in the color material dispersion liquid or in the below-described color resin composition and which are able to dissolve or disperse them. Concrete examples thereof include organic solvents such as alcohol-based solvents, ether alcohol-based solvents, ester-based solvents, ketone-based solvents, ether alcohol acetate-based solvents, ether-based solvents, aprotic amide-based solvents, lactone-based solvents, unsaturated hydrocarbon-based solvents and saturated hydrocarbon-based solvents. Of them, ester-based solvents are preferred from the viewpoint of solubility upon dispersion and coating properties.

Examples of preferred ester-based solvents include methyl methoxypropionate, ethyl ethoxypropionate, methoxy ethyl acetate, propylene glycol monomethyl ether acetate, 3-methoxy-3-methyl-1-butyl acetate, 3-methoxybutyl acetate, methoxybutyl acetate, ethoxy ethyl acetate, ethyl cellosolve acetate, dipropylene glycol methyl ether acetate, propylene glycol diacetate, 1,3-butylene glycol diacetate, cyclohexanol acetate, 1,6-hexanediol diacetate, diethylene glycol monoethyl ether acetate, and diethylene glycol monobutyl ether acetate.

Of them, propylene glycol monomethyl ether acetate (PGMEA) is preferred, from the point of view that it has a low risk to the human body and has fast heat-drying properties although it has low volatility at around room temperature. In this case, there is such an advantage that a special washing step is not needed when switching from a conventional color resin composition using PGMEA.

These solvents can be used alone or in combination of two or more kinds.

The color material dispersion liquid according to an embodiment of the present invention is prepared by the use of the solvent (C) generally in an amount of 50 to 95% by mass, preferably 60 to 85% by mass, with respect to the total amount of the color material dispersion liquid. As the solvent amount decreases, the viscosity increases and the dispersibility decreases. As the solvent amount increases, the color material concentration decreases and may result in a difficulty in achieving a target chromaticity coordinate after preparation of the color resin composition for color filters.
(Other Components)

The color material dispersion liquid according to an embodiment of the present invention can further contain a dispersion assisting resin and other components as needed, as long as the effects of the present invention are not impaired.

Examples of the dispersion assisting resin include an alkali soluble resin which will be mentioned below under "Color resin composition for color filters". The particles of the color material becomes less likely to contact with each other due to steric hindrance by the alkali soluble resin, resulting in stabilization of particle dispersion, and the particle dispersion stabilization effect may be effective in reducing the dispersant.

Examples of the other components include a surfactant, which is used to increase wettability, a silane coupling agent, which is used to increase adhesion properties, a defoaming agent, a cissing inhibitor, an antioxidant, an aggregation inhibitor and an ultraviolet absorber.

The color material dispersion liquid according to an embodiment of the present invention is used as a preliminarily prepared product for preparing the below-described color resin composition for color filters. That is, the color material dispersion liquid is a color material dispersion liquid which is preliminarily prepared at a stage prior to preparing the below-described color resin composition and whose "the mass of the color material component in the composition"/"the mass of the solid content other than the color material component in the composition" ratio is high. In particular, this ratio ("the mass of the color material component in the composition"/"the mass of the solid content other than the color material component in the composition" ratio) is generally 1.0 or more. By mixing the color material dispersion liquid with at least a binder component, a color resin composition with excellent dispersibility can be prepared.
[Method for Producing the Color Material Dispersion Liquid]

In an embodiment of the present invention, the method for producing the color material dispersion liquid is needed to be a method which can contain the color material (A), the dispersant (B), the solvent (C) and various kinds of additional components used as needed, and which can homogeneously disperse the color material (A) in the solvent by the dispersant. The color material dispersion liquid can be prepared by mixing them with a known mixing means.

The dispersion liquid can be prepared by the following method: the dispersant (B) is mixed with the solvent (C) and stirred to produce a dispersant solution; the dispersant solution is mixed with the color material (A) and, as needed, other component; and the mixture is dispersed with a known stirrer or disperser, thereby preparing the dispersion liquid. Also, the color material dispersion liquid according to an embodiment of the present invention can be prepared as follows: a color material dispersion liquid in which the color material (A-1) is dispersed and a color material dispersion liquid in which the color material (A-2) is dispersed, are separately prepared and mixed together, thereby preparing the color material dispersion liquid of the present invention.

As the disperser used for the dispersion treatment, there may be mentioned roller mills such as a two-roller mill and a three-roller mill, ball mills such as a vibrating ball mill, paint conditioners, bead mills such as a continuous disk type bead mill and a continuous annular type bead mill, for example. In the case of using a bead mill, a preferred dispersion condition is that the diameter of the beads used is 0.03 to 2.00 mm, more preferably 0.10 to 1.0 mm.

In particular, a preparatory dispersion is carried out with 2 mm zirconia beads, which is a relatively large bead diameter, and then a main dispersion is further carried out with 0.1 mm zirconia beads, which is a relatively small bead diameter. It is preferable to carry out filtration with a 0.5 to 5.0 μm membrane filter after the dispersion treatment.
2. Color Resin Composition for Color Filters The color resin composition for color filters can be prepared by adding (D) a binder component to the color material dispersion liquid for color filters according to an embodiment of the present invention.

That is, the color resin composition for color filters can be one which contains the color material (A), the dispersant (B), the solvent (C) and the binder component (D) and in which the color material (A) contains the color material (A-1) represented by the general formula (I) and the metal lake color material (A-2) of the rhodamine-based acid dye.

This color resin composition for color filters has excellent heat resistance, is inhibited from subliming even when heated at high temperature, and is able to form a high-luminance color layer.

The color resin composition contains the color material (A), the dispersant (B), the solvent (C) and the binder component (D), and it can contain other components as needed.

Hereinafter, such a color resin composition for color filters will be described. However, the color material (A), the dispersant (B) and the solvent (C) will not be described below, since they can be the same as those of the above-described color material dispersion liquid according to an embodiment of the present invention.
[(D) Binder Component]

To provide film-forming and surface adhesion properties, the color resin composition for color filters contains a binder component. To provide sufficient hardness to coating films, the color resin composition preferably contains a curable binder component. The curable binder component is not particularly limited, and conventionally-known curable binder components that are used to form the color layers of color filters, can be appropriately used.

As the curable binder component, for example, there may be used one containing a photocurable binder component that contains a photocurable resin, which is polymerizable and curable by visible light, ultraviolet, electron beam radiation, etc., or one containing a thermosetting binder component that contains a thermosetting resin, which is polymerizable and curable by heating.

No developability is required of the curable binder component, when color layers can be formed by attaching the color resin composition for color filters selectively in a pattern onto a substrate (e.g., the ink-jet method). In this case, a known thermosetting or photosensitive binder component which is used to form the color layers of color filters by the ink-jet method, etc., can be appropriately used.

As the thermosetting binder, a combination of a compound having two or more thermosetting functional groups per molecule and a curing agent is generally used. In addition, a catalyst which can promote a thermosetting reaction can be added. Examples of thermosetting functional groups include an epoxy group, an oxetanyl group, an isocyanate group and an ethylenically unsaturated bond. As the thermosetting functional groups, epoxy groups are preferably used. Concrete examples of the thermosetting binder component include those mentioned in International Publication No. WO2012/144521.

In the case of using a photolithography process to form color layers, a photosensitive binder component with alkali developability is suitably used.

Hereinafter, photosensitive binder components will be explained. However, the curable binder component used in an embodiment of the present invention is not limited to them. Besides the below-described photosensitive binder components, a thermosetting binder component that is polymerizable and curable by heating, such as epoxy resin, can be further used.

Photosensitive binder components include a positive photosensitive binder component and a negative photosensitive binder component. Examples of the positive photosensitive binder component include those containing an alkali soluble resin and an o-quinonediazide group-containing compound, which is a photosensitivity-imparting component.

On the other hand, as the negative photosensitive binder component, those containing at least an alkali soluble resin, a polyfunctional monomer and a photoinitiator, are suitably used.

In the color resin composition for color filters, the negative photosensitive binder component is preferred, from the point of view that a pattern can be easily formed by a photolithography method, using existing processes.

Hereinafter, the alkali soluble resin, the polyfunctional monomer and the photoinitiator, which constitute the negative photosensitive binder component, will be explained in detail.

(Alkali Soluble Resin)

In an embodiment of the present invention, the alkali soluble resin can be appropriately selected, as long as it has an acidic group, functions as a binder resin, and is soluble in developers used for pattern formation, particularly preferably in an alkaline developer.

In an embodiment of the present invention, the alkali soluble resin is preferably a resin having a carboxyl group as the acidic group. Concrete examples thereof include acrylic copolymers having a carboxyl group and epoxy (meth)acrylate resins having a carboxyl group. Of them, particularly preferred is one having a carboxyl group and, moreover, a photopolymerizable functional group such as an ethylenically unsaturated group in a side chain thereof. This is because the hardness of the cured film thus formed is increased by containing the photopolymerizable functional group. These acrylic copolymers and epoxy (meth)acrylate resins can be used in combination of two or more kinds.

An acrylic copolymer having a carboxyl group is obtained by copolymerizing a carboxyl group-containing ethylenically unsaturated monomer and an ethylenically unsaturated monomer.

The acrylic copolymer having a carboxyl group can further contain a constitutional unit having an aromatic carbon ring. The aromatic carbon ring functions as a component which imparts coatability to the color resin composition for color filters.

The acrylic copolymer having a carboxyl group can further contain a constitutional unit having an ester group. The constitutional unit having an ester group not only functions as a component which inhibits the alkali solubility of the color resin composition for color filters, but also functions as a component which increases the solubility and re-solubility in solvents.

Concrete examples of the acrylic copolymer having a carboxyl group include those described in International Publication No. WO2012/144521. In particular, there may be mentioned copolymers obtained from a monomer having no carboxyl group, such as methyl (meth)acrylate and ethyl (meth)acrylate, with one or more selected from (meth)acrylic acid and anhydrides thereof. Also, there may be mentioned polymers obtained by introducing an ethylenically unsaturated bond in the above copolymers by, for example, addition of an ethylenically unsaturated compound having a reactive functional group such as a glycidyl group or hydroxyl group. In an embodiment of the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure, and more stable color filters can be obtained.

The copolymerization ratio of the carboxyl group-containing ethylenically unsaturated monomer in the carboxyl group-containing copolymer is generally 5 to 50% by mass, preferably 10 to 40% by mass. When the copolymerization ratio of the carboxyl group-containing ethylenically unsaturated monomer is less than 5% by mass, the solubility of the coating film thus obtained in alkaline developers is decreased, resulting in a difficulty with pattern formation. When the copolymerization ratio exceeds 50% by mass, upon development with an alkaline developer, a pattern thus formed is likely to come off of the substrate, or the pattern surface is likely to be roughened.

The molecular weight of the carboxyl group-containing copolymer is preferably in a range of 1,000 to 500,000, more preferably in a range of 3,000 to 200,000. When the molecular weight is less than 1,000, there may be a remarkable decrease in binder function after curing. When the molecular weight exceeds 500,000, upon development with an alkaline developer, pattern formation may be difficult.

The epoxy (meth)acrylate resin having a carboxyl group is not particularly limited. As the resin, an epoxy (meth)acrylate compound obtained by reaction of an acid anhydride with a reaction product of an epoxy compound and an unsaturated group-containing monocarboxylic acid, is suitable.

The epoxy compound, the unsaturated group-containing monocarboxylic acid and the acid anhydride can be appropriately selected from known ones. Concrete examples thereof include those described in International Publication No. WO2012/144521. As each of the epoxy compound, the unsaturated group-containing monocarboxylic acid and the acid anhydride, those mentioned above can be used alone or in combination of two or more kinds.

The alkali soluble resin used in the color resin composition for color filters can be one kind of alkali soluble resin or a combination of two or more kinds of alkali soluble resins. The content of the alkali soluble resin is generally in a range of 10 to 1,000 parts by mass, preferably in a range of 20 to 500 parts by mass, with respect to 100 parts by mass of the color material contained in the color resin composition. When the content of the alkali soluble resin is too small, sufficient alkali developability may not be obtained. When the content is too large, the ratio of the color material is relatively small, so that sufficient color density may not be obtained.

(Polyfunctional Monomer)

The polyfunctional monomer used in the color resin composition for color filters is not particularly limited, as long as it is polymerizable with the below-described photoinitiator. As the polyfunctional monomer, a compound having two or more ethylenically unsaturated double bonds is generally used. Preferably, the polyfunctional monomer is a polyfunctional (meth)acrylate having two or more acryloyl or methacryloyl groups.

Such a polyfunctional (meth)acrylate can be appropriately selected from conventionally known ones. Concrete examples thereof include those mentioned in International Publication No. WO2012/144521.

These polyfunctional (meth)acrylates can be used alone or in combination of two or more kinds. When excellent photocurability (high sensitivity) is required of the color resin composition the present invention, the polyfunctional monomer is preferably one having three (trifunctional) or more polymerizable double bonds. Preferred are poly(meth) acrylates of trivalent or higher polyalcohols and dicarboxylic acid-modified products thereof. Concrete examples thereof include trimethylolpropane tri(meth)acrylate, pentaerythritol tri(meth)acrylate and succinic acid-modified products of pentaerythritol tri(meth)acrylate, pentaerythritol tetra(meth)acrylate, dipentaerythritol tetra(meth)acrylate, dipentaerythritol penta(meth)acrylate and succinic acid-modified products of dipentaerythritol penta(meth)acrylate, and dipentaerythritol hexa(meth)acrylate.

The content of the polyfunctional monomer used in the color resin composition for color filters is not particularly limited. It is generally about 5 to 500 parts by mass, preferably in a range of 20 to 300 parts by mass, with respect to 100 parts by mass of the alkali soluble resin. When the content of the polyfunctional monomer is smaller than the range, photocuring may not proceed sufficiently and the color resin composition exposed to light may be dissolved. When the content of the polyfunctional monomer is larger than the range, there may be a decrease in alkali developability.

(Photoinitiator)

The photoinitiator used in the color resin composition for color filters is not particularly limited. As the photoinitiator, conventionally-known various kinds of photoinitiators can be used alone or in combination of two or more kinds. Concrete examples thereof include those mentioned in International Publication No. WO2012/144521.

The content of the photoinitiator used in the color resin composition for color filters is generally about 0.01 to 100 parts by mass, preferably 5 to 60 parts by mass, with respect to 100 parts by mass of the polyfunctional monomer. When the content is smaller than the range, sufficient polymerization reaction may not be caused, so that the hardness of the color layer may not be sufficient. When the content is larger than the range, the content of the color material and so on in the solid content of the color resin composition is relatively small, so that sufficient color density may not be obtained.

<Optionally-Added Compounds>

As needed, the color resin composition for color filters can further contain other color material or various kinds of additives.

(Other Color Material)

Other color material can be added as needed, for the purpose of color tone adjustment. For example, it can be selected from conventionally-known pigments and dyes, according to the purpose, and such pigments and dyes can be used alone or in combination of two or more kinds.

As the other color material, it is particularly preferable to use the color material described in International Publication No. WO2012/144521, which contains the divalent or higher cation represented by the general formula (II) and a divalent or higher anion.

Concrete examples of the other color material include pigments such as C. I. Pigment Violet 1, C. I. Pigment Violet 2, C. I. Pigment Violet 3, C. I. Pigment Violet 19, C. I. Pigment Violet 23, C. I. Pigment Blue 1, C. I. Pigment Blue 15, C. I. Pigment Blue 15:3, C. I. Pigment Blue 15:4, C. I. Pigment Blue 15:6, C. I. Pigment Blue 60, C. I. Pigment Red 81, C. I. Pigment Red 82, and dyes such as Acid Red.

In the case of using the other color material, the content is not particularly limited. Especially in the case of using the color material described in International Publication No. WO2012/144521 as the other color material, which contains the divalent or higher cation represented by the general formula (II) and a divalent or higher anion, the color material can be preferably used in a desired amount.

The content of the other color material is preferably 40 parts by mass or less, more preferably 20 parts by mass or less, with respect to 100 parts by mass (the total amount) of the color material (A). This is because when the content is in this range, color tone can be adjusted without impairing the properties of the color material represented by the general formula (I), such as high transmittance, heat resistance and light resistance.

(Antioxidant)

From the viewpoint of heat resistance and light resistance, it is preferable that the color resin composition for color filters further contains an antioxidant. The antioxidant can be appropriately selected from conventionally-known antioxidants. Concrete examples of the antioxidant include a hindered phenol-based antioxidant, an amine-based antioxidant, a phosphorus-based antioxidant, a sulfur-based antioxidant and a hydrazine-based antioxidant. From the viewpoint of heat resistance, it is preferable to use a hindered phenol-based antioxidant.

The hindered phenol-based antioxidant means an antioxidant that contains at least one phenol structure in which at least one of the 2- and 6-positions of the hydroxyl group is substituted with a substituent group having 4 or more carbon atoms.

In the case of using the antioxidant, the amount is not particularly limited, as long as it is in a range that does not impair the effects of the present invention. The amount of the antioxidant used is preferably 0.1 to 5.0 parts by mass, more preferably 0.5 to 4.0 parts by mass, with respect to 100 parts by mass (the total solid content) of the color resin composition. When the amount of the antioxidant used is equal to or more than the lower limit, excellent heat resistance can be obtained. On the other hand, when the amount is equal to or less than the upper limit, the color resin composition can be a highly-sensitive photosensitive resin composition.

(Other Additives)

Examples of additives include, besides the above-mentioned antioxidant, a polymerization inhibitor, a chain transfer agent, a leveling agent, a plasticizer, a surfactant, a defoaming agent, a silane coupling agent, an ultraviolet absorber and an adhesion enhancing agent.

Concrete examples of the surfactant and the plasticizer include those mentioned in International Publication No. WO2012/144521.

<The Content of Each Component in the Color Resin Composition>

The total content of the color material (A) is preferably 3 to 65% by mass, more preferably 4 to 55% by mass, with respect to the total solid content of the color resin composition. When the total content is equal to or more than the lower limit, the color layer obtained by applying the color resin composition for color filters to a predetermined thickness (generally 1.0 to 5.0 μm) can have sufficient color density. When the total content is equal to or less than the upper limit, excellent dispersibility and dispersion stability can be obtained, and a color layer with sufficient hardness and adhesion to the substrate can be obtained. In an embodiment of the present invention, "solid content" includes all the above-described components other than the solvent, and it also includes the polyfunctional monomer in a liquid form.

Also, the content of the dispersant (B) is not particularly limited, as long as the color material (A) can be homogeneously dispersed. For example, preferably, the dispersant content can be 3 to 40 parts by mass, with respect to the total solid content of the color resin composition. More preferably, the content can be 5 to 35 parts by mass, particularly preferably 5 to 25 parts by mass, with respect to the total solid content of the color resin composition. When the content is equal to or more than the lower limit, the color material (A) can have excellent dispersibility and dispersion stability, and it can have excellent storage stability. When the content is equal to or less than the upper limit, excellent developability can be obtained.

The total amount of the binder component (D) is preferably 10 to 92% by mass, more preferably 15 to 87% by mass, with respect to the total solid content of the color resin composition. When the total amount is equal to or more than the lower limit, a color layer with sufficient hardness and adhesion to the substrate can be obtained. When the total amount is equal to or less than the upper limit, excellent developability can be obtained, and generation of fine wrinkles can be inhibited, which is due to heat shrinkage.

The content of the solvent (C) can be appropriately determined in a range which can form a color layer with accuracy. In general, the content is preferably in a range of 55 to 95% by mass, particularly preferably in a range of 65 to 88% by mass, with respect to the total amount of the color resin composition including the solvent. When the content of the solvent is in the range, excellent coatability can be provided to the color resin composition.

<Method for Producing the Color Resin Composition for Color Filters>

The method for producing the color resin composition for color filters is not particularly limited, as long as it is a method in which the color material (A), the dispersant (B), the solvent (C), the binder component (D) and various kinds of additional components that are added as needed are contained, and the color material (A) can be homogeneously dispersed in the solvent (C) by the dispersant (B). The color resin composition can be prepared by mixing them using a known mixing means.

Examples of the method for preparing the color resin composition include the following: (1) a method of mixing the color material dispersion liquid according to an embodiment of the present invention with the binder component (D) and various kinds of additional components used as needed; (2) a method of adding the color material (A), the dispersant (B), the binder component (D) and various kinds of additional components used as needed to the solvent (C) at the same time and mixing them; and (3) a method of adding the dispersant (B), the binder component (D) and various kinds of additional components used as needed to the solvent (C), mixing them, adding the color material (A) thereto and then mixing them.

Of these methods, the method (1) is preferred, from the viewpoint of effectively inhibiting the color material from aggregation and homogeneously dispersing the color material.

4. Color Filter

The color filter of the present invention is a color filter including at least a transparent substrate and color layers disposed on the substrate, wherein at least one of the color layers contains (A-1) a color material represented by the following general formula (I) and (A-2) a metal lake color material of a rhodamine-based acid dye:

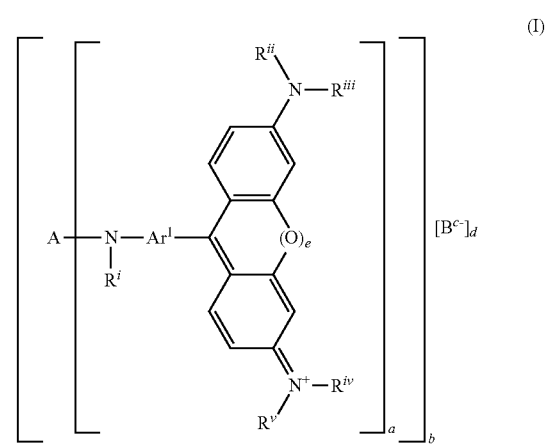

(symbols in the general formula (I) are as described above.)

Such a color filter of the present invention will be explained with reference to figures. FIG. 1 is a schematic sectional view of an example of the color filter of the present invention. According to FIG. 1, a color filter 10, which is the color filter according to an embodiment of the present invention, includes a transparent substrate 1, a light shielding part 2 and a color layer 3.

(Color Layer)

At least one of the color layers used in the color filter according to an embodiment of the present invention is a color layer that contains the color material (A-1) represented by the general formula (I) and the metal lake color material (A-2) of the rhodamine-based acid dye.

It is generally formed on an opening of the light shielding part on the below-described transparent substrate and is generally composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layer is appropriately controlled by controlling the applying method, the solid content concentration, viscosity, etc., of the color resin composition for color filters. In general, the thickness is preferably in a range of 1 to 5 µm.

For example, when the color resin composition for color filters is a photosensitive resin composition, the color layer can be formed by the following method. It is preferable that the color layer which is used in the color filter according to an embodiment of the present invention and contains the color material (A-1) represented by the general formula (I) and the metal lake color material (A-2) of the rhodamine-based acid dye, is formed using the above-described color resin composition for color filters, which contains the color material (A), the dispersant (B), the solvent (C) and the binder component (D) and in which the color material (A) contains the color material (A-1) represented by the general formula (I) and the metal lake color material (A-2) of the rhodamine-based acid dye. It is also preferable that the color layer is a cured product of the color resin composition for color filters.

First, the color resin composition for color filters is applied onto the below-described transparent substrate by a coating method such as a spray coating method, a dip coating method, a bar coating method, a roll coating method or a spin coating method to form a wet coating film.

Then, the wet coating film is dried with a hot plate, an oven, etc. The dried film is subjected to exposure through a mask with a given pattern to cause a photopolymerization reaction of the alkali soluble resin, the polyfunctional monomer, etc., thereby obtaining a photosensitive coating film. Examples of light sources and lights that can be used for the exposure include a low pressure mercury lamp, a high pressure mercury lamp and a metal halide lamp, and ultraviolet rays and electron beams. The exposure amount is appropriately controlled, depending on the used light source and the thickness of the coating film.

The film can be heated to promote a polymerization reaction after the exposure. The heating condition is appropriately determined, depending on the content ratio of the components used in the color resin composition according to an embodiment of the present invention, the thickness of the coating film, etc.

Next, the thus-obtained film is developed with a developer to dissolve and remove unexposed portions, thereby forming a coating film in a desired pattern. As the developer, a solution obtained by dissolving alkali in water or aqueous solvent, is generally used. An appropriate amount of surfactant, etc., can be added to the alkali solution. The developing method can be selected from general developing methods.

After the developing treatment, generally, the developer is rinsed off, followed by drying of the cured coating film of the color resin composition, thereby forming a color layer. To sufficiently cure the coating film, a heating treatment can be carried out after the developing treatment. The heating condition is not particularly limited and is appropriately determined depending on the intended use of the coating film.

(Light Shielding Part)

In the color filter according to an embodiment of the present invention, the light shielding part is formed in pattern on the below-described transparent substrate, and it can be the same as those used in general color filters.

The pattern shape of the light shielding part is not particularly limited, and examples thereof include a stripe-shaped pattern, a matrix-shaped pattern, etc. As the light shielding part, for example, there may be mentioned one produced by dispersing or dissolving a black pigment in a binder resin, and thin metal layers of chromium, chromium oxide, etc. When the light shielding part is such a thin metal layer, the layer can be a stack of two layers of one $CrO_x$ layer (x is an arbitrary number) and one Cr layer, or it can be a stack of three layers of one $CrO_x$ layer (x is an arbitrary number), one $CrN_y$ layer (y is an arbitrary number) and one Cr layer, the stack of three layers having a further reduced reflectance.

When the light shielding part is one produced by dispersing or dissolving a black color material in a binder resin, the method for producing the light shielding part is not particularly limited and is only required to be a method which can pattern the light shielding part. For example, there may be mentioned a photolithography method using a color resin composition for the light shielding part, a printing method using the same, an ink-jet method using the same, etc.

When the light shielding part is a thin metal layer, the thickness is about 0.2 to 0.4 µm. When the light shielding part is formed from the black color material dispersed or dissolved in the binder resin, the thickness is about 0.5 to 2 µm.

(Transparent Substrate)

The transparent substrate of the color filter according to an embodiment of the present invention is not particularly limited, as long as it is a substrate that is transparent to visible light. It can be selected from general transparent substrates used in color filters. Concrete examples thereof include inflexible transparent rigid materials such as silica glass plate, non-alkali glass plate and synthetic silica plate, and transparent flexible materials with flexibility and flexible properties, such as transparent resin film, optical resin plate and flexible glass.

The thickness of the transparent substrate is not particularly limited. Depending on the intended use of the color filter according to an embodiment of the present invention, one having a thickness of about 100 µm to 1 mm can be used, for example.

In addition to the transparent substrate, the light shielding part and the color layer, the color filter according to an embodiment of the present invention can also contain an overcoat layer and a transparent electrode layer, for example. Moreover, an orientation layer and a columnar spacer can be formed in the color filter.

5. Liquid Crystal Display Device

The liquid crystal display device according to an embodiment of the present invention is a liquid crystal display device including the above-described color filter, a counter substrate, and a liquid crystal layer disposed between the color filter and the counter substrate.

Figure 2:
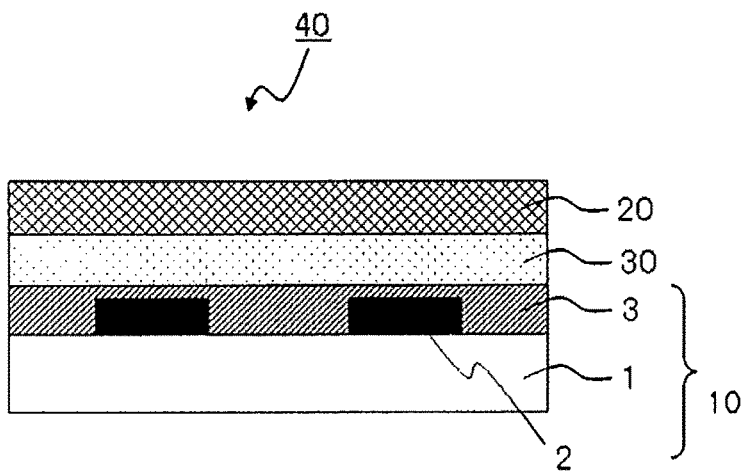
FIG. 2 is a schematic sectional view of an example of the liquid crystal display device according to an embodiment of the present invention.

Such a liquid crystal display device according to an embodiment of the present invention will be explained with reference to a figure. FIG. 2 is a schematic view of an example of the liquid crystal display device according to an embodiment of the present invention. As shown in FIG. 2, a liquid crystal display device 40, which is the liquid crystal display device according to an embodiment of the present invention, includes a color filter 10, a counter substrate 20 including a TFT array substrate, etc., and a liquid crystal layer 30 formed between the color filter 10 and the counter substrate 20.

The liquid crystal display device according to an embodiment of the present invention is not limited to the configuration shown in FIG. 2. It can be a configuration which is generally known as a liquid crystal display device including a color filter.

The method for driving the liquid crystal display device according to an embodiment of the present invention is not particularly limited and can be selected from driving methods which are generally used in liquid crystal display devices. Examples of such driving methods include a TN method, an IPS method, an OCB method and an MVA method. In an embodiment of the present invention, any of these methods can be suitably used.

The counter substrate can be appropriately selected, depending on the driving method, etc., of the liquid crystal display device according to an embodiment of the present invention.

Also, the liquid crystal constituting the liquid crystal layer can be selected from various liquid crystals with varying dielectric anisotropies and mixtures thereof, depending on the driving method, etc., of the liquid crystal display device according to an embodiment of the present invention.

The method for forming the liquid crystal layer can be selected from methods which are generally used to produce liquid crystal cells. Examples thereof include a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, while it is in the form of isotropic liquid, using the capillary effect; and the liquid crystal cell is encapsulated with an adhesive agent, thereby forming a liquid crystal layer. Then, the encapsulated liquid crystal can be oriented by gradually cooling the liquid crystal cell to room temperature.

In the liquid crystal dripping method, for example, a sealing agent is applied to the periphery of the color filter; the color filter is heated to the temperature at which the liquid crystal enters an isotropic phase; the liquid crystal is dripped with a dispenser or the like, while it is in the form of isotropic liquid; and the color filter and the counter substrate are stacked under reduced pressure and attached to each other via the applied sealing agent, thereby forming a liquid crystal layer. Then, the encapsulated liquid crystal can be oriented by gradually cooling the liquid crystal cell to room temperature.

6. Organic Light-Emitting Display Device

The organic light-emitting display device according to an embodiment of the present invention includes the above-described color filter and an organic light-emitting material.

Figure 3:
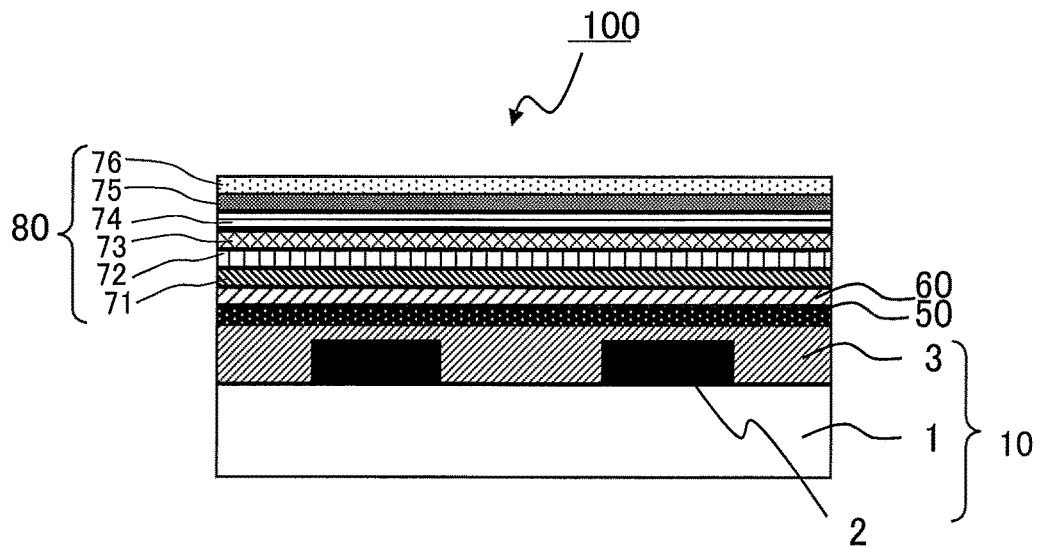
FIG. 3 is a schematic sectional view of an example of the organic light-emitting display device according to an embodiment of the present invention.

Such an organic light-emitting display device according to an embodiment of the present invention will be explained with reference to a figure. FIG. 3 is a schematic view of an example of the organic light-emitting display device according to an embodiment of the present invention. As shown in FIG. 3, an organic light-emitting display device 100, which is the organic light-emitting display device according to an embodiment of the present invention, includes a color filter 10 and an organic light-emitting material 80. An organic protection layer 50 and/or an inorganic oxide layer 60 can be disposed between the color filter 10 and the organic light-emitting material 80.

As the method for stacking the components of the organic light-emitting material 80, for example, there may be mentioned a method of stacking a transparent positive electrode 71, a positive hole injection layer 72, a positive hole transport layer 73, a light-emitting layer 74, an electron injection layer 75 and a negative electrode 76 in this sequence on the color filter, and a method of attaching the organic light-emitting material 80 formed on a different substrate onto the inorganic oxide layer 60. The transparent positive electrode 71, the positive hole injection layer 72, the positive hole transport layer 73, the light-emitting layer 74, the electron injection layer 75, the negative electrode 76 and other components of the organic light-emitting material 80 can be appropriately selected from conventionally-known materials. The organic light-emitting display device 100 produced as above is applicable to both passive and active drive organic EL displays, for example.

The organic light-emitting display device according to an embodiment of the present invention is not limited to the configuration shown in FIG. 3. It can have any one of configurations which are generally known as those of organic light-emitting display devices using a color filter.

EXAMPLES

Hereinafter, the present invention will be described in detail, by way of examples. The present invention is not limited by these examples.

Synthesis Example 1: Synthesis of Triarylmethane-Based Lake Color Material a (1) Synthesis of Intermediate 1

With reference to the method for producing intermediates 3 and 4 described in International Publication No. WO2012/144521, 15.9 g of an intermediate 1 represented by the following chemical formula (1) was obtained (yield 70%).

The compound thus obtained was confirmed to be a target compound from the following analysis results:

MS (ESI) (m/z): 511 (+), divalent

Elemental analysis values: CHN measurement values (78.13%, 7.48%, 7.78%); theoretical values (78.06%, 7.75%, 7.69%)

Chemical Formula (1)

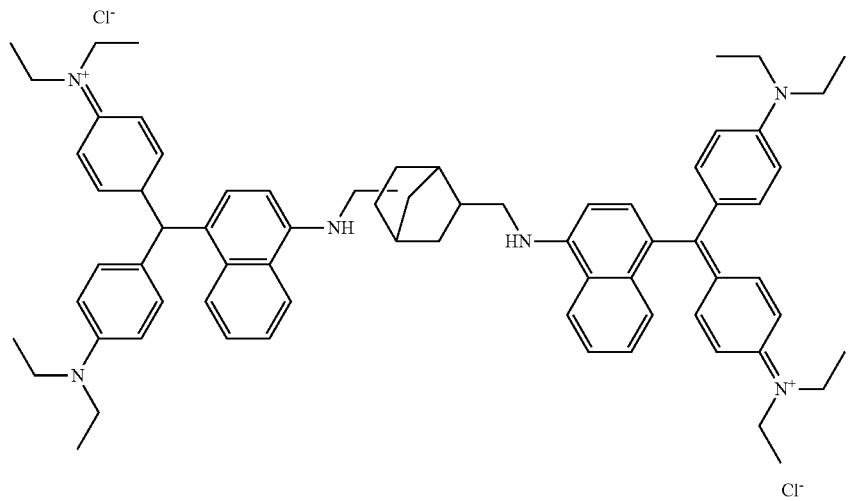

(2) Synthesis of Triarylmethane-Based Lake Color Material A

First, 5.00 g (4.58 mmol) of the intermediate 1 was added to 300 ml of water and dissolved at 90° C. to prepare an intermediate 1 solution. Then, 10.44 g (3.05 mmol) of phosphotungstic acid n-hydrate $H_3[PW_{12}O_{40}]\cdot nH_2O$ (manufactured by Nippon Inorganic Colour & Chemical Co., Ltd., n=30) was added to 100 ml of water, and the mixture was stirred at 90° C. to prepare a phosphotungstic acid aqueous solution. The intermediate 1 solution was mixed with the phosphotungstic acid aqueous solution at 90° C. A precipitate thus produced was obtained by filtration and washed with water. A cake thus obtained was dried, thereby obtaining 13.25 g of a triarylmethane-based lake color material A represented by the following chemical formula (2) (yield 98%).

The compound thus obtained was confirmed to be a target compound from the following analysis results (mol ratio W/Mo=100/0):

MS (ESI) (m/z): 510(+), divalent

Elemental analysis values: CHN measurement values (41.55%, 5.34%, 4.32%); theoretical values (41.66%, 5.17%, 4.11%)

Chemical Formula (2)

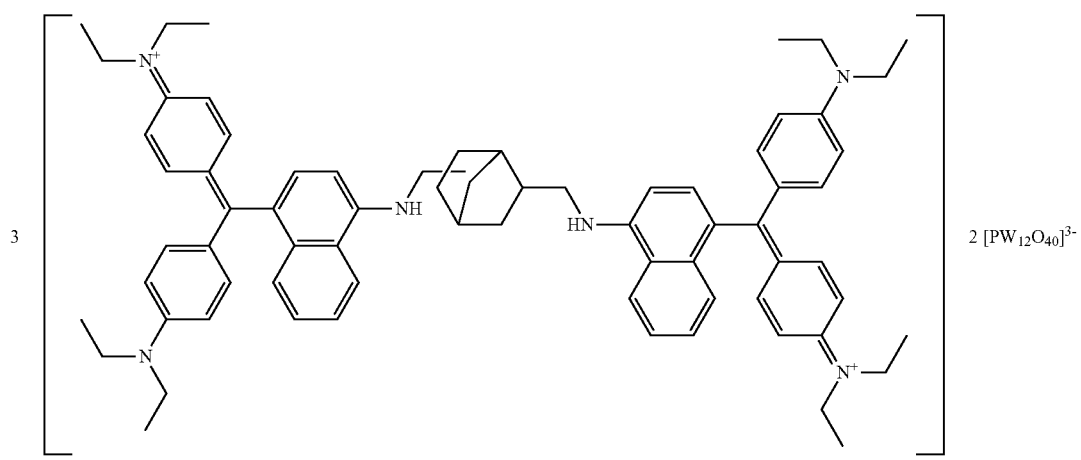

Synthesis Example 2: Synthesis of Color Material A

First, 5.0 g of Acid Red 289 (manufactured by Tokyo Chemical Industry Co., Ltd., a rhodamine-based acid dye represented by the following chemical formula (3)) was added to 500 ml of water and dissolved at 80° C. to prepare a dye solution. Then, 1.24 g of aluminum sulfate (manufactured by Kanto Chemical Co., Inc.) was added to 200 ml of water, and the mixture was stirred at 40° C. to prepare an aluminum sulfate aqueous solution. The dye solution was left to cool to 40° C. The aluminum sulfate aqueous solution thus prepared was added to the dye solution in a dropwise manner for 15 minutes at 40° C., and the mixture was stirred at 40° C. for 1 hour. A precipitate thus produced was obtained by filtration and washed with water. A cake thus obtained was dried, thereby obtaining 2.38 g of a metal lake color material A of the rhodamine-based acid dye (yield 44.9%).

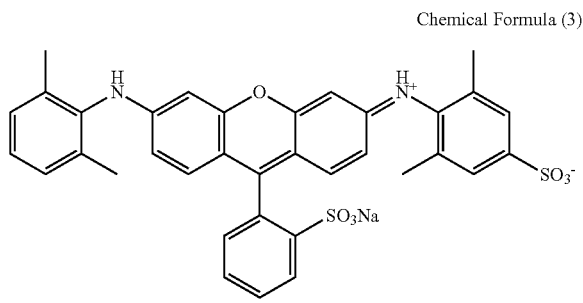

Chemical Formula (3)

Synthesis Example 3: Synthesis of Color Material B

First, 5.0 g of Acid Red 289 was added to 500 ml of water and dissolved at 80° C. to prepare a dye solution. Then, 4.10 g of anhydrous calcium chloride (manufactured by Wako Pure Chemical Industries, Ltd.) was added to 200 ml of water, and the mixture was stirred at 40° C. to prepare a calcium chloride aqueous solution. The dye solution was left to cool to 40° C. The calcium chloride aqueous solution thus prepared was added to the dye solution in a dropwise manner for 15 minutes at 40° C., and the mixture was stirred at 40° C. for 1 hour. A precipitate thus produced was obtained by filtration and washed with water. A cake thus obtained was dried, thereby obtaining 2.24 g of a metal lake color material B of the rhodamine-based acid dye (yield 35.5%).

Synthesis Example 4: Synthesis of Color Material C

First, 5.0 g of Acid Red 289 was added to 500 ml of water and dissolved at 80° C. to prepare a dye solution. Then, 36.77 g of polyaluminum chloride (product name: Polyaluminum chloride for tap water, manufactured by: Tosoh Corporation, $[Al_2(OH)_nCl_{(6-n)}]_m$ (n=1 to 5, m=10 or less), basicity 53.9% by mass, alumina content 10.2% by mass) was added to 200 ml of water, and the mixture was stirred at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 8.28 g of a metal lake color material C of the rhodamine-based acid dye (yield 65.6%).

Synthesis Example 5: Synthesis of Color Material D

First, 5.0 g of Acid Red 289 was added to 500 ml of water and dissolved at 80° C. to prepare a dye solution. Then, 3.49 g of polyaluminum chloride (product name: TAN WHITE, manufactured by: Taki Chemical Co., Ltd., $Al_4(OH)_9Cl_3$, basicity 74.5% by mass, alumina content 23% by mass) was added to 200 ml of water, and the mixture was stirred at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 5.88 g of a metal lake color material D of the rhodamine-based acid dye (yield 91.2%).

Synthesis Example 6: Synthesis of Color Material E

First, 5.0 g of Acid Red 289 was added to 500 ml of water and dissolved at 80° C. to prepare a dye solution. Then, 3.85 g of polyaluminum chloride (product name: Takibine #1500, manufactured by: Taki Chemical Co., Ltd., $Al_2(OH)_5Cl$, basicity 83.5% by mass, alumina content 23.5% by mass) was added to 200 ml of water, and the mixture was stirred at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 6.30 g of a metal lake color material E of the rhodamine-based acid dye (yield 96.2%).

Synthesis Example 7: Synthesis of Color Material F

First, 5.0 g of Acid Red 52 (manufactured by Tokyo Chemical Industry Co., Ltd., a rhodamine-based acid dye represented by the following chemical formula (4)) was added to 500 ml of water and dissolved at 80° C. to prepare a dye solution. Then, 4.58 g of TAN WHITE was added to 200 ml of water to prepare a polyaluminum chloride aqueous solution. The dye solution was cooled to 5° C. with an ice bath. The polyaluminum chloride aqueous solution thus produced was added to the dye solution in a dropwise manner for 15 minutes at 5° C., and the mixture was stirred at 5° C. for 1 hour. A precipitate thus obtained by filtration and washed with water. A cake thus obtained was dried, thereby obtaining 6.21 g of a metal lake color material F of the rhodamine-based acid dye (yield 90.0%).

Chemical Formula (4)

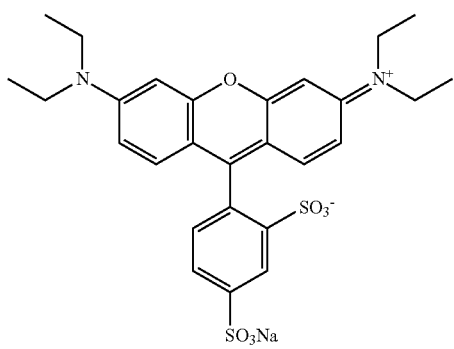

Comparative Synthesis Example 1: Synthesis of Color Material G

First, 5.0 g of Acid Red 87 (manufactured by Tokyo Chemical Industry Co., Ltd. a fluorescein-based dye represented by the following chemical formula (5)) was added to 500 ml of water and dissolved at 80° C. to prepare a dye solution. Then, 4.27 g of TAN WHITE was added to 200 ml of water and dissolved at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 5.07 g of a color material G (yield 74.9%).

Chemical Formula (5)

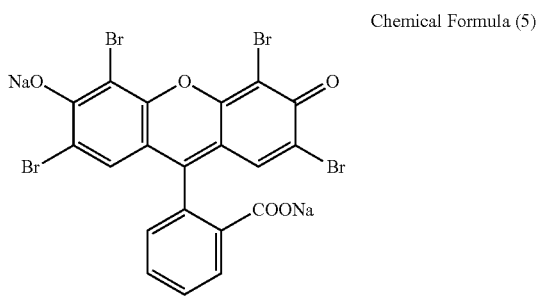

Comparative Synthesis Example 2: Synthesis of Color Material H

First, 5.0 g of Acid Red 92 (manufactured by Tokyo Chemical Industry Co., Ltd., a fluorescein-based dye represented by the following chemical formula (6)) was added to 500 ml of water and dissolved at 80° C. to prepare a dye solution. Then, 3.56 g of TAN WHITE was added to 200 ml of water, and the mixture was stirred at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 5.12 g of a color material H (yield 79.1%).

Chemical Formula (6)

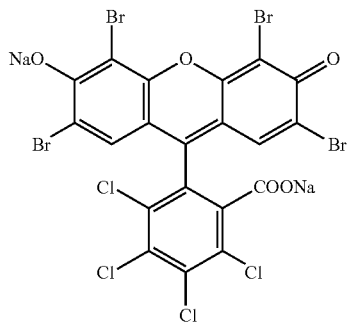

Comparative Synthesis Example 3: Synthesis of Color Material I

First, 5.0 g of Acid Red 94 (manufactured by Tokyo Chemical Industry Co., Ltd., a fluorescein-based dye represented by the following chemical formula (7)) was added to 500 ml of water and dissolved at 80° C. to prepare a dye solution. Then, 2.90 g of TAN WHITE was added to 200 ml of water, and the mixture was stirred at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 5.27 g of a color material I (yield 85.0%).

Chemical Formula (7)

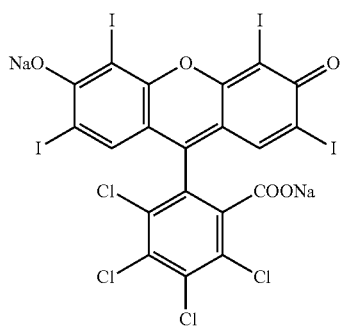

Comparative Synthesis Example 4: Synthesis of Color Material J

First, 5.0 g of Rhodamine 6G (manufactured by Tokyo Chemical Industry Co., Ltd., a rhodamine-based basic dye represented by the following chemical formula (8)) was added to 500 ml of water and dissolved at 90° C. to prepare a dye solution. Then, 11.90 g of phosphotungstic acid n-hydrate $H_3[PW_{12}O_{40}] \cdot nH_2O$ (manufactured by Nippon Inorganic Colour & Chemical Co., Ltd., n=30) was added to 200 ml of water, and the mixture was stirred at 90° C. to prepare a phosphotungstic acid aqueous solution. The aqueous solution was added to the dye solution in a dropwise manner for 15 minutes at 90° C., and the mixture was stirred at 90° C. for 1 hour. A precipitate thus produced was obtained by filtration and washed with water. A cake thus obtained was dried, thereby obtaining 13.45 g of a color material J (yield 91.9%).

Chemical Formula (8)

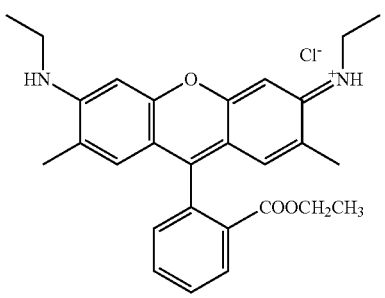

Comparative Synthesis Example 5: Synthesis of Color Material K

First, 5.0 g of Acid Violet 17 (manufactured by Aldrich, a triphenylmethane-based dye represented by the following chemical formula (9)) was added to 500 ml of water and dissolved at 80° C. to prepare a dye solution. Then, 2.91 g of TAN WHITE was added to 200 ml of water, and the mixture was stirred at 40° C. to prepare a polyaluminum chloride aqueous solution. The dye solution was left to cool to 40° C. The polyaluminum chloride aqueous solution thus prepared was added to the dye solution in a dropwise manner for 15 minutes at 40° C., and the mixture was stirred at 40° C. for 1 hour. A precipitate thus produced was obtained by filtration and washed with water. A cake thus obtained was dried, thereby obtaining 3.75 g of a color material K (yield 60.4%).

Chemical Formula (9)

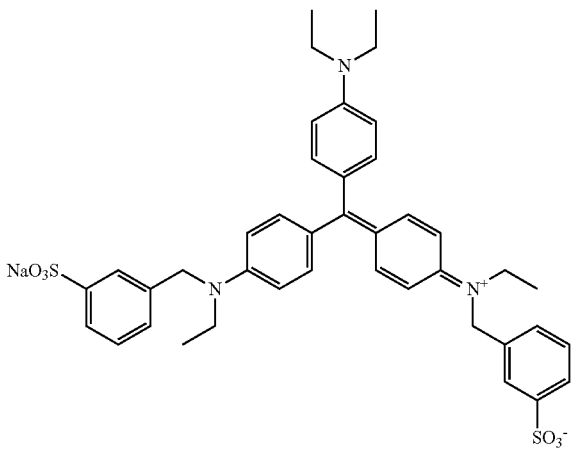

Comparative Synthesis Example 6: Synthesis of Color Material L

First, 5.0 g of Direct Red 39 (manufactured by Tokyo Chemical Industry Co., Ltd., an azo-based dye represented by the following chemical formula (10)) was added to 500 ml of water and dissolved at 80° C. to prepare a dye solution. Then, 4.19 g of TAN WHITE was added to 200 ml of water, and the mixture was stirred at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 4.31 g of a color material L (yield 64.0%).

Chemical Formula (10)

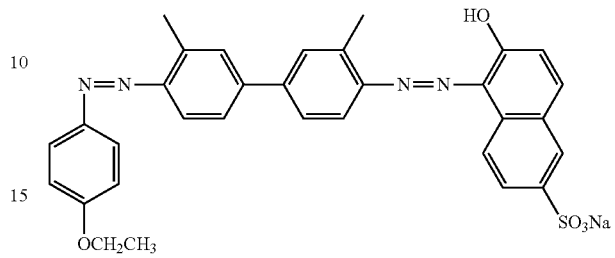

Comparative Synthesis Example 7: Synthesis of Color Material M

First, 5.0 g of Acid Blue 74 (manufactured by Tokyo Chemical Industry Co., Ltd., an indigo-based dye represented by the following chemical formula (11)) was added to 500 ml of water and dissolved at 80° C. to prepare a dye solution. Then, 10.14 g of TAN WHITE was added to 200 ml of water, and the mixture was stirred at 80° C. to prepare a polyaluminum chloride aqueous solution. The polyaluminum chloride aqueous solution thus prepared was added to the dye solution in a dropwise manner for 15 minutes at 80° C., and the mixture was stirred at 80° C. for 1 hour. A precipitate thus produced was obtained by filtration and washed with water. A cake thus obtained was dried, thereby obtaining 6.18 g of a color material M (yield 67.2%).

Chemical Formula (11)

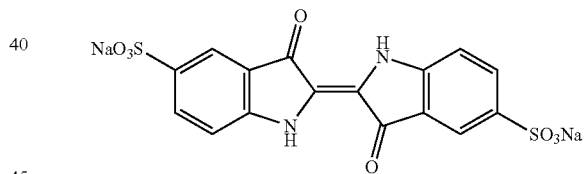

Synthesis Example 8: Synthesis of Binder Resin A

First, 130 parts by mass of diethylene glycol ethyl methyl ether (EMDG), which is a solvent, was put in a reactor equipped with a cooling tube, an addition funnel, a nitrogen inlet, a mechanical stirrer and a digital thermometer. After the temperature of the solvent was increased to 90° C. under a nitrogen atmosphere, a mixture of 32 parts by mass of methyl methacrylate, 22 parts by mass of cyclohexyl methacrylate, 24 parts by mass of methacrylic acid, and 2.0 parts by mass of AIBN, which is an initiator, and 4.5 parts by mass of n-dodecyl mercaptan, which is a chain transfer agent, was continuously added to the solvent in a dropwise manner for 1.5 hours.

Then, with maintaining the synthesis temperature, the reaction was continued. Two hours after the completion of the addition of the mixture in a dropwise manner, 0.05 part by mass of p-methoxyphenol, which is a polymerization inhibitor, was added thereto.

Next, with injecting air into the mixture, 22 parts by mass of glycidyl methacrylate was added to the mixture. After the temperature of the mixture was increased to 110° C., 0.2 part by mass of triethylamine was added thereto, and an addition reaction was caused at 110° C. for 15 hours in the mixture, thereby obtaining a binder resin A (solid content 44% by mass).

The binder resin A thus obtained had a mass average molecular weight (Mw) of 8,500, a number average molecular weight (Mn) of 4,200, a molecular weight distribution (Mw/Mn) of 2.02, and an acid value of 85 mgKOH/g.

Synthesis Example 9: Synthesis of Organic Phosphonate Ester Compound A

First, 142.61 parts by mass of diethylene glycol ethyl methyl ether (EMDG), 50.00 parts by mass of phenylphosphonic acid (product name: PPA; manufactured by: Nissan Chemical Industries, Ltd.) and 0.10 part by mass of p-methoxyphenol were put in a reactor equipped with a cooling tube, an addition funnel, a nitrogen inlet, a mechanical stirrer and a digital thermometer. With stirring the mixture under a nitrogen atmosphere, the temperature of the mixture was increased to 120° C. Then, 44.96 parts by mass of glycidyl methacrylate (GMA) was added to the mixture in a dropwise manner for 30 minutes. The mixture was then heated and stirred for 2 hours, thereby obtaining a 40.0% by mass solution of an organic phosphonate ester compound 1 containing an organic phosphonate monoester compound, in which half the divalent acidic groups of the PPA were esterified with the epoxy groups of the GMA. The progress of the esterification reaction was confirmed by an acid value measurement. The composition ratio of the product thus obtained was confirmed by a $^{31}$P-NMR measurement. The acid value was 190 mgKOH/g. The composition ratio was as follows: the organic phosphonate monoester compound was 55% by mass; the organic phosphonate diester compound was 23% by mass; and the PPA was 22% by mass.

Preparation Example 1: Preparation of Salt-Type Block Polymer Dispersant A Solution In a reactor, 60.74 parts by mass of PGMEA and 35.64 parts by mass (active solid content 21.38 parts by mass) of a block copolymer containing tertiary amino groups (product name: BYK-LPN 6919; manufactured by: BYK-Chemie GmbH) (amine value 120 mgKOH/g, solid content 60% by weight) were dissolved. Then, 3.62 parts by mass (0.5 molar equivalent with respect to the tertiary amino groups of the block copolymer) of PPA was added to the mixture. The mixture was stirred at 40° C. for 30 minutes, thereby preparing a salt-type block polymer dispersant A solution (solid content 25%).

Preparation Example 2: Preparation of Salt-Type Block Polymer Dispersant B Solution In a reactor, 50.19 parts by mass of PGMEA and 25.38 parts by mass (active solid content 15.23 parts by mass) of BYK-LPN 6919 were dissolved. Then, 24.44 parts by mass (active solid content 9.78 parts by mass) (1.0 molar equivalent with respect to the tertiary amino groups of the block copolymer) of the organic phosphonate ester compound A of Synthesis Example 9 was added to the mixture. The mixture was stirred at 40° C. for minutes, thereby preparing a salt-type block polymer dispersant B solution (solid content 25%).

Preparation Example 3: Preparation of Binder Composition A

A binder composition A (solid content 40% by mass) was prepared by mixing 19.82 parts by mass of PGMEA, 18.18 parts by mass of the binder resin A of Synthesis Example 8 (solid content 44% by mass), 8.00 parts by mass of a pentafunctional to hexafunctional acrylate monomer (product name: ARONIX M403, manufactured by TOAGOSEI Co., Ltd.), 3.00 parts by mass of 2-methyl-1[4-(methylthio)phenyl]-2-morpholinopropane-1-one (product name: Irgacure 907, manufactured by: BASF) and 1.00 part by mass of 2,4diethylthioxanthone (product name: KAYACURE DETX-S, manufactured by: Nippon Kayaku Co., Ltd.)

Example 1

(1) Preparation of Color Material Dispersion Liquid A

First, 12.15 parts by mass of the triarylmethane-based lake color material A of Synthesis Example 1, 0.85 part by mass of the metal lake color material A of the rhodamine-based acid dye of Synthesis Example 2, 20.80 parts by mass (active solid content 5.20 parts by mass) of the salt-type block polymer dispersant A solution prepared in Preparation Example 1, 11.82 parts by mass (active solid content 5.20 parts by mass) of the binder resin A of Synthesis Example 8, and 54.38 parts by mass of PGMEA were mixed. Using a paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining a color material dispersion liquid A.

(2) Preparation of Color Resin Composition A

First, 28.57 parts by mass of the color material dispersion liquid A obtained in the above (1), 28.29 parts by mass of the binder composition A obtained in Preparation Example 3, 43.14 parts by mass of PGMEA, 0.04 part by mass of surfactant R08MH (manufactured by DIC) and 0.4 part by mass of silane coupling agent KBM503 (manufactured by Shin-Etsu Silicones) were mixed. The mixture thus obtained was subjected to pressure filtration, thereby obtaining a blue color resin composition A.

Examples 2 to 8

(1) Preparation of Color Material Dispersion Liquids B to H

Color material dispersion liquids B to H were prepared in the same manner as the above (1) in Example 1, except that the components were changed to those shown in the following Table 1.

(2) Preparation of Color Resin Compositions B to H

Blue color resin compositions B to H were obtained in the same manner as the above (2) in Example 1, except that the color material dispersion liquids B to H obtained above were used in place of the color material dispersion liquid A.

Comparative Examples 1 to 10

(1) Preparation of Color Material Dispersion Liquids I to R

Color material dispersion liquids I to R were prepared in the same manner as the above (1) in Example 1, except that the components were changed to those shown in the following Table 1.

(2) Preparation of Color Resin Compositions I to R

Blue color resin compositions I to R were obtained in the same manner as the above (2) in Example 1, except that the color material dispersion liquids I to R obtained above were used in place of the color material dispersion liquid A.

In Table 1, "Phthalocyanine-based pigment" is Pigment Blue 15:6; "Dioxazine-based pigment" is Pigment Violet 23; and "Urethane-based dispersant" is Disperbyk-161 (manufactured by BYK-Chemie GmbH, solid content 30% by mass).

TABLE 1

| | Color material dispersion liquid | Blue color material (part by mass) | Violet color material (part by mass) | Dispersant (part by mass, (solid content part by mass)) | Binder resin (part by mass) | Solvent (part by mass) |
|---|---|---|---|---|---|---|
| Example 1 | Color material dispersion liquid A | Triarylmethane-based lake color material 12.15 | Color material A 0.85 | Salt-type block polymer dispersant A 20.80 (5.2) | Binder resin A 11.82 (5.2) | PGMEA 54.38 |
| Example 2 | Color material dispersion liquid B | Triarylmethane-based lake color material 12.02 | Color material B 0.98 | Salt-type block polymer dispersant A 20.80 (5.2) | Binder resin A 11.82 (5.2) | PGMEA 54.38 |
| Example 3 | Color material dispersion liquid C | Triarylmethane-based lake color material 12.02 | Color material C 0.98 | Salt-type block polymer dispersant A 20.80 (5.2) | Binder resin A 11.82 (5.2) | PGMEA 54.38 |
| Example 4 | Color material dispersion liquid D | Triarylmethane-based lake color material 12.02 | Color material D 0.98 | Salt-type block polymer dispersant A 20.80 (5.2) | Binder resin A 11.82 (5.2) | PGMEA 54.38 |
| Example 5 | Color material dispersion liquid E | Triarylmethane-based lake color material 12.02 | Color material D 0.98 | Salt-type block polymer dispersant B 20.80 (5.2) | Binder resin A 11.82 (5.2) | PGMEA 54.38 |
| Example 6 | Color material dispersion liquid F | Triarylmethane-based lake color material 12.02 | Color material D 0.98 | Urethane-based dispersant 17.33 (5.2) | Binder resin A 11.82 (5.2) | PGMEA 57.85 |
| Example 7 | Color material dispersion liquid G | Triarylmethane-based lake color material 12.02 | Color material E 0.98 | Salt-type block polymer dispersant A 20.80 (5.2) | Binder resin A 11.82 (5.2) | PGMEA 54.38 |
| Example 8 | Color material dispersion liquid H | Triarylmethane-based lake color material 11.31 | Color material F 1.69 | Salt-type block polymer dispersant A 20.80 (5.2) | Binder resin A 11.82 (5.2) | PGMEA 54.38 |
| Comparative Example 1 | Color material dispersion liquid I | Triarylmethane-based lake color material 11.05 | Color material G 1.95 | Salt-type block polymer dispersant A 20.80 (5.2) | Binder resin A 11.82 (5.2) | PGMEA 54.38 |
| Comparative Example 2 | Color material dispersion liquid J | Triarylmethane-based lake color material 11.05 | Color material H 1.95 | Salt-type block polymer dispersant A 20.80 (5.2) | Binder resin A 11.82 (5.2) | PGMEA 54.38 |
| Comparative Example 3 | Color material dispersion liquid K | Triarylmethane-based lake color material 11.05 | Color material I 1.95 | Salt-type block polymer dispersant A 20.80 (5.2) | Binder resin A 11.82 (5.2) | PGMEA 54.38 |
| Comparative Example 4 | Color material dispersion liquid L | Triarylmethane-based lake color material 11.96 | Color material J 1.04 | Salt-type block polymer dispersant A 20.80 (5.2) | Binder resin A 11.82 (5.2) | PGMEA 54.38 |
| Comparative Example 5 | Color material dispersion liquid M | Triarylmethane-based lake color material 11.05 | Color material K 1.95 | Salt-type block polymer dispersant A 20.80 (5.2) | Binder resin A 11.82 (5.2) | PGMEA 54.38 |
| Comparative Example 6 | Color material dispersion liquid N | Triarylmethane-based lake color material 11.05 | Color material L 1.95 | Salt-type block polymer dispersant A 20.80 (5.2) | Binder resin A 11.82 (5.2) | PGMEA 54.38 |
| Comparative Example 7 | Color material dispersion liquid O | Triarylmethane-based lake color material 11.05 | Color material M 1.95 | Salt-type block polymer dispersant A 20.80 (5.2) | Binder resin A 11.82 (5.2) | PGMEA 54.38 |
| Comparative Example 8 | Color material dispersion liquid P | Triarylmethane-based lake color material 11.70 | Dioxazine-based pigment (PV23) 1.30 | Salt-type block polymer dispersant A 20.80 (5.2) | Binder resin A 11.82 (5.2) | PGMEA 54.38 |
| Comparative Example 9 | Color material dispersion liquid Q | Phthalocyanine-based pigment (PB15:6) 10.40 | Color material J 2.60 | Salt-type block polymer dispersant A 20.80 (5.2) | Binder resin A 11.82 (5.2) | PGMEA 54.38 |
| Comparative Example 10 | Color material dispersion liquid R | Phthalocyanine-based pigment (PB15:6) 9.75 | Dioxazine-based pigment (PV23) 3.25 | Salt-type block polymer dispersant A 20.80 (5.2) | Binder resin A 11.82 (5.2) | PGMEA 54.38 |

(Evaluation)
<Dispersion Performance Evaluation>

To evaluate the dispersion performance of the color material dispersion liquids used in Examples and Comparative Examples, the average particle diameter and shear viscosity of the color material particles in the color material dispersion liquids were measured. To measure the average particle diameter, "Nanotrac Particle Size Analyzer UPA-EX150" (manufactured by Nikkiso Co., Ltd.) was used. To measure the viscosity, "Rheometer MCR301" (manufactured by Anton Paar) was used. Using this, the shear viscosity at a shear rate of 60 rpm was measured. The average particle diameter used herein means both the average dispersed particle diameter and the volume average particle diameter. Results are shown in Table 2.

<Optical Performance Evaluation, Heat Resistance Evaluation>

Each of the blue color resin compositions obtained in Examples and Comparative Examples was applied onto a glass substrate having a thickness of 0.7 mm ("OA-10G" manufactured by Nippon Electric Glass Co., Ltd.) using a spin coater, heat-dried on a hot plate at 80° C. for 3 minutes, and then irradiated with ultraviolet light at 40 mJ/cm² using a ultrahigh-pressure mercury lamp, thereby obtaining a cured film (blue color layer). The thickness of the film was determined so as to have a target chromaticity (y=0.082) after drying and curing. The chromaticity (x, y), luminance (Y) and L, a, b ($L_0$, $a_0$, $b_0$) of the obtained color substrate were measured using microscopic Spectrophotometer "OSP-SP200" manufactured by Olympus Corporation. The substrate on which the color layer was formed, was subjected to post-baking in a clean oven at 230° C. for 30 minutes. The chromaticity (x, y), luminance (Y) and L, a, b ($L_1$, $a_1$, $b_1$) of the thus-obtained color layer were measured again. In addition, the contrast value was measured using contrast measuring device "CT-1B" manufactured by Tsubosaka Electric Co., Ltd.

To evaluate heat resistance, ΔEab, which is a difference in chromaticity before and after the post-baking, was calculated by the following formula. It is considered to be excellent in heat resistance when ΔEab is 5 or less.

$$\Delta Eab = \{(L_1-L_0)^2 + (a_1-a_0)^2 + (b_1-b_0)^2\}^{1/2}$$

Results are shown in Table 2.

<Color Transfer Evaluation>

Each of the blue color resin compositions obtained in Examples and Comparative Examples was applied onto a glass substrate having a thickness of 0.7 mm ("OA-10G" manufactured by Nippon Electric Glass Co., Ltd.) using a spin coater and heat-dried on a hot plate at 80° C. for 3 minutes. A color layer thus obtained was irradiated with ultraviolet light at 40 mJ/cm² using a ultrahigh-pressure mercury lamp, through a photomask with a 80 μm line-and-space stripe pattern. Then, the glass plate on which the color layer was formed, was subjected to shower development for 60 seconds, using a 0.05% by mass potassium hydroxide aqueous solution as an alkaline developer.

Then, the glass plate was washed with ultrapure water for 60 seconds.

A glass substrate was placed 0.7 mm above the glass substrate on which a color pattern thus obtained was formed, and the glass substrate on which the color pattern was formed was heated on a hot plate at 230° C. for 30 minutes. To evaluate sublimability (color transfer), the upper glass substrate was visually observed to see if there is a color transfer.

○: No color transfer
  Δ: Slight color transfer
  x: Much color transfer

Results are shown in Table 2.

TABLE 2

| | Color material dispersion liquid | Dispersion performance | | Optical performance (before post-baking) | | | | Optical performance (after post-baking) | | | | | Color transfer |
|---|---|---|---|---|---|---|---|---|---|---|---|---|---|
| | | Particle diameter (nm) | Viscosity (mPa·s) | x | y | Y | Contrast | x | y | Y | Contrast | ΔEab | |
| Example 1 | Color material dispersion liquid A | 121 | 5.5 | 0.143 | 0.082 | 10.53 | 3550 | 0.146 | 0.082 | 10.20 | 3620 | 2.5 | ○ |
| Example 2 | Color material dispersion liquid B | 130 | 5.5 | 0.142 | 0.082 | 10.45 | 2705 | 0.145 | 0.082 | 10.16 | 3110 | 2.4 | ○ |
| Example 3 | Color material dispersion liquid C | 110 | 5.6 | 0.143 | 0.082 | 10.57 | 3873 | 0.145 | 0.082 | 10.24 | 4010 | 1.8 | ○ |
| Example 4 | Color material dispersion liquid D | 100 | 5.5 | 0.143 | 0.082 | 10.60 | 4430 | 0.146 | 0.082 | 10.31 | 4520 | 1.8 | ○ |
| Example 5 | Color material dispersion liquid E | 74 | 5.2 | 0.143 | 0.082 | 10.63 | 4576 | 0.146 | 0.082 | 10.31 | 4650 | 1.9 | ○ |
| Example 6 | Color material dispersion liquid F | 115 | 7.0 | 0.142 | 0.082 | 10.58 | 4005 | 0.145 | 0.082 | 10.23 | 4150 | 2.8 | ○ |

TABLE 2-continued

| | Color material dispersion liquid | Dispersion performance Particle diameter (nm) | Viscosity (mPa·s) | Optical performance (before post-baking) | | | | Optical performance (after post-baking) | | | | | Color transfer |
|---|---|---|---|---|---|---|---|---|---|---|---|---|---|
| | | | | x | y | Y | Contrast | x | y | Y | Contrast | ΔEab | |
| Example 7 | Color material dispersion liquid G | 99 | 5.6 | 0.143 | 0.082 | 10.63 | 4961 | 0.146 | 0.082 | 10.32 | 4556 | 1.9 | ○ |
| Example 8 | Color material dispersion liquid H | 102 | 5.8 | 0.142 | 0.082 | 10.57 | 5388 | 0.145 | 0.082 | 10.27 | 4305 | 2.2 | ○ |
| Comparative Example 1 | Color material dispersion liquid I | 84 | 5.7 | 0.153 | 0.082 | 9.75 | 4572 | 0.144 | 0.082 | 7.68 | 3704 | 44.5 | x |
| Comparative Example 2 | Color material dispersion liquid J | 89 | 6.5 | 0.145 | 0.082 | 10.42 | 5009 | 0.144 | 0.082 | 7.35 | 4249 | 31.9 | Δ |
| Comparative Example 3 | Color material dispersion liquid K | 92 | 7.1 | 0.142 | 0.082 | 10.43 | 5718 | 0.142 | 0.082 | 7.65 | 4746 | 23.8 | Δ |
| Comparative Example 4 | Color material dispersion liquid L | 106 | 5.5 | 0.143 | 0.082 | 10.65 | 4358 | 0.146 | 0.082 | 10.18 | 4705 | 3.6 | x |
| Comparative Example 5 | Color material dispersion liquid M | 146 | 5.1 | 0.142 | 0.082 | 10.29 | 2484 | 0.140 | 0.082 | 9.51 | 5320 | 23.7 | ○ |
| Comparative Example 6 | Color material dispersion liquid N | 101 | 5.9 | 0.143 | 0.082 | 7.54 | 1157 | 0.141 | 0.082 | 8.26 | 2795 | 16.8 | ○ |
| Comparative Example 7 | Color material dispersion liquid O | 99 | 5.5 | 0.139 | 0.082 | 9.99 | 5257 | 0.140 | 0.082 | 9.53 | 4726 | 2.9 | ○ |
| Comparative Example 8 | Color material dispersion liquid P | 90 | 6.0 | 0.143 | 0.082 | 10.25 | 4028 | 0.146 | 0.082 | 9.79 | 4301 | 3.1 | ○ |
| Comparative Example 9 | Color material dispersion liquid Q | 133 | 16.6 | 0.145 | 0.082 | 9.28 | 1559 | 0.146 | 0.082 | 9.03 | 2599 | 5.3 | x |
| Comparative Example 10 | Color material dispersion liquid R | 45 | 10.2 | 0.147 | 0.082 | 9.05 | 3555 | 0.147 | 0.082 | 8.86 | 3731 | 1.4 | ○ |

[Conclusion]

For the color layers obtained by the use of the color material dispersion liquids of Examples 1 to 8, in which the color material (A-1) represented by the general formula (I) is combined with the metal lake color material (A-2) of the rhodamine-based acid dye, the luminance values after the post-baking were high; the difference in chromaticity before and after the post-baking (ΔEab) was 3 or less and, therefore, the heat resistance was excellent; and no color material sublimed. Especially, Examples 4 to 8 using the metal lake color material of the rhodamine-based acid dye, which used the polyaluminum chloride represented by the general formula (II) as the laking agent, was excellent in dispersibility and particularly had high contrast values after the post-baking.

For Comparative Examples 1 to 3 using the color materials obtained by forming the lake of the fluorescein-based dyes among xanthene-based acidic dyes with the polyaluminum chloride, ΔEab was large, and the heat resistance was remarkably poor. In addition, color transfer was observed, and the color materials sublimed.

For Comparative Example 5 using the color material obtained by forming the lake of the triphenylmethane-based acidic dye, although the luminance values before the post-baking were high, the luminance values greatly decreased after the post-baking, and ΔEab was large. For Comparative Example 6 using the color material obtained by forming the lake of the azo-based acidic dye, the luminance values were low even before the post-baking; the luminance values were also low even after the post-baking; and ΔEab was large. For Comparative Example 7 using the color material obtained by forming the lake of the indigo-based dye, when combined with the color material (A-1), the color tone showed almost no change even after the content ratio was changed, and only the luminance values decreased.

From the results of Comparative Examples 4 and 9, it is clear that rhodamine-based dyes sublime in the case where they are basic dyes.

REFERENCE SIGNS LIST

1. Transparent substrate
2. Light shielding part
3. Color layer
10. Color filter
20. Counter substrate
30. Liquid crystal layer
40. Liquid crystal display device
50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Organic light-emitting material
100. Organic light-emitting display device

The invention claimed is:

1. A color material dispersion liquid for color filters comprising: (A) a color material, (B) a dispersant, and (C) a solvent,
wherein the color material contains
a metal lake color material of a rhodamine-based acid dye, the rhodamine-based acid dye being represented by the following general formula (III), and
a laking agent that is a polyaluminum chloride represented by the following general formula (II):

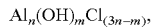  General Formula (II):

$Al_n(OH)_m Cl_{(3n-m)}$, wherein "n" is an integer of 2 to 20, and "m" is an integer of (n/2) to (3n−1);

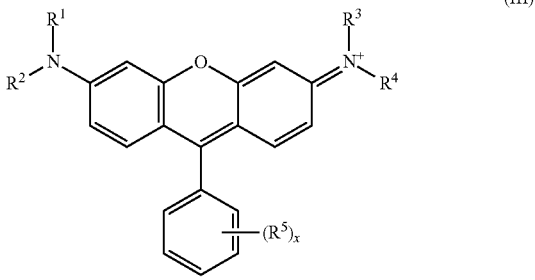

wherein each of $R^1$, $R^2$, $R^3$ and $R^4$ is independently a hydrogen atom or a straight- or branched-chain alkyl group which has 1 to 20 carbon atoms and optionally has a substituent group,
the substituent group that the alkyl group optionally has is a halogen atom or an aryl group, and the aryl group further optionally has a halogen atom, an acidic group, or a salt thereof as a second substituent group,
$R^5$ is an acidic group or a salt thereof,
"x" is an integer of 0 to 5, and
the general formula (III) has at least two acidic groups or salts thereof, and one of the at least two acidic groups or salts thereof forms an intramolecular salt.

2. A color material dispersion liquid for color filters, according to claim 1,
wherein "n" of General Formula (II) is an integer of 2 to 10, and "m" is an integer of 2n to (3n−1).

* * * * *